(12) United States Patent
Ueta et al.

(10) Patent No.: US 12,707,802 B2
(45) Date of Patent: Aug. 11, 2026

(54) LIGHT-EMITTING ELEMENT

(71) Applicant: Sharp Display Technology Corporation, Kameyama City (JP)

(72) Inventors: Yoshihiro Ueta, Kameyama City (JP); Takayuki Naka, Kameyama City (JP)

(73) Assignee: Sharp Display Technology Corporation, Kameyama City (JP)

( * ) Notice: Subject to any disclaimer, the term of this patent is extended or adjusted under 35 U.S.C. 154(b) by 359 days.

(21) Appl. No.: 18/686,276

(22) PCT Filed: Oct. 15, 2021

(86) PCT No.: PCT/JP2021/038311
§ 371 (c)(1),
(2) Date: Feb. 23, 2024

(87) PCT Pub. No.: WO2023/062840
PCT Pub. Date: Apr. 20, 2023

(65) Prior Publication Data
US 2025/0204146 A1 Jun. 19, 2025

(51) Int. Cl.

| | |
|---|---|
| ***H10K 50/17*** | (2023.01) |
| ***H05B 33/14*** | (2006.01) |
| ***H10K 50/115*** | (2023.01) |
| ***H10K 50/15*** | (2023.01) |
| ***H10K 102/00*** | (2023.01) |

(52) U.S. Cl.
CPC ........... *H10K 50/17* (2023.02); *H10K 50/115* (2023.02); *H10K 50/15* (2023.02); *H05B 33/145* (2013.01); *H10K 2102/331* (2023.02); *H10K 2102/351* (2023.02)

(58) Field of Classification Search
CPC ...... H10K 50/115; H10K 50/15; H10K 50/17; H10K 2102/331; H10K 2102/351; H05B 33/14; H05B 33/145; H05B 33/20
See application file for complete search history.

(56) References Cited

U.S. PATENT DOCUMENTS

| | | | | |
|---|---|---|---|---|
| 2007/0069202 | A1* | 3/2007 | Choi | B82Y 30/00 977/700 |
| 2007/0087389 | A1 | 4/2007 | Matsuda et al. | |
| 2008/0309234 | A1 | 12/2008 | Cho et al. | |
| 2011/0101303 | A1 | 5/2011 | Choi et al. | |
| 2017/0110679 | A1 | 4/2017 | Choy et al. | |
| 2019/0081263 | A1* | 3/2019 | Park | H10K 50/115 |
| 2019/0280235 | A1* | 9/2019 | Kim | H10K 50/115 |

(Continued)

FOREIGN PATENT DOCUMENTS

| | | | |
|---|---|---|---|
| JP | 2007-095685 | A | 4/2007 |
| JP | 2019-160796 | A | 9/2019 |

(Continued)

OTHER PUBLICATIONS

Jian Lin et al., "High-Performance Quantum-Dot Light-Emitting Diodes Using NiOx Hole-Injection layers with a High and Stable Work Function", Advanced Functional Materials, Nov. 18, 2019, vol. 30, 1907265-(1-8).

(Continued)

*Primary Examiner* — Matthew E Warren
(74) *Attorney, Agent, or Firm* — ScienBiziP, P.C.

(57) ABSTRACT

A monolayer film is provided between a hole injection layer and the hole transport layer.

13 Claims, 19 Drawing Sheets

(56) References Cited

U.S. PATENT DOCUMENTS

| | | | | |
|---|---|---|---|---|
| 2019/0296255 | A1* | 9/2019 | Kim | H10K 50/115 |
| 2019/0348623 | A1* | 11/2019 | Dohner | C09K 11/025 |
| 2021/0091325 | A1 | 3/2021 | Kim et al. | |
| 2021/0119164 | A1 | 4/2021 | Kim et al. | |
| 2023/0035091 | A1* | 2/2023 | Ueta | H10H 20/812 |
| 2023/0303918 | A1* | 9/2023 | Yaguchi | C09K 11/025 |

FOREIGN PATENT DOCUMENTS

| | | | | | |
|---|---|---|---|---|---|
| JP | 2022050363 | A | * | 3/2022 | |
| KR | 20210026158 | A | * | 3/2021 | H10K 85/00 |
| WO | WO-2013157494 | A1 | * | 10/2013 | H10K 85/6574 |
| WO | WO-2023053450 | A1 | * | 4/2023 | H10K 50/15 |
| WO | WO-2023053451 | A1 | * | 4/2023 | H10K 50/15 |

OTHER PUBLICATIONS

Hyun Soo Kim et al., "All-solution-processed quantum-dot light emitting diodes with nickel oxide nanoparticles as a hole injection layer", Molecular Crystals and Liquid Crystals, Jul. 29, 2019, vol. 678, pp. 33-42.

Yuanbao Lin et al., "Self-Assembled Monolayer Enables Hole Transport Layer-Free Organic Solar Cells with 18% Efficiency and Improved Operational Stability", ACS Energy Letters, Aug. 18, 2020, vol. 5, pp. 2935-2944.

Juanjuan Sun et al., "NiOx-Seeded Self-Assembled Monolayers as Highly Hole-Selective Passivating Contacts for Efficient Inverted Perovskite Solar Cells", Solar RRL, Oct. 1, 2021, vol. 5, 2100663-(1-8).

* cited by examiner

LIGHT-EMITTING ELEMENT

TECHNICAL FIELD

The disclosure relates to a light-emitting element.

BACKGROUND ART

Quantum dot light emitting diodes (QLEDs) are increasingly common.

Cited Document 1 describes a QLED including a hole injection layer (HIL) that includes nickel oxide nanoparticles and organic ligands.

Cited Document 2 describes a QLED including an electron transport layer (ETL) that includes an inorganic layer including two or more inorganic nanoparticles and an organic layer formed directly above the inorganic layer and having a higher work function than the inorganic layer.

Cited Document 3 describes a QLED including a tunnel layer, a bipolar layer, a dielectric layer, an insulating layer, or a combination thereof between an electrode and a light-emitting layer.

Cited Document 4 describes a thin film transistor (TFT) including a self-assembly monolayer (SAM) between an insulating layer and an organic semiconductor layer.

Cited Document 5 describes a QLED including a light-emitting layer that includes semiconductor nanocrystal particles and a filling material for filling gaps between the semiconductor nanocrystal particles.

CITATION LIST

Patent Literature

PTL 1: US 2021/0091325 A1 (published on May 25, 2021)

PTL 2: JP 2019-160796 (published on Sep. 19, 2019)

PTL 3: US 2008/0309234 A1 (published on Dec. 18, 2008)

PTL 4: US 2007/0087389 A1 (published on Apr. 19, 2007)

PTL 5: JP 2007-95685 (published on Apr. 12, 2007)

SUMMARY

Technical Problem

However, such known techniques have a problem in that light-emission characteristics such as the external quantum efficiency (EQE) and the reliability are low.

For example, in the HIL including the organic ligands described in Cited Document 1, the organic ligands deteriorate due to an electrochemical reaction and separated from the quantum dots. For example, in the HIL including the organic hole transport material described in Cited Document 2, the organic hole transport material deteriorates due to an electrochemical reaction. In addition, since a QLED generally operates in a state where electrons are excessive, electrons overflow from a light-emitting layer to a hole transport layer (HTL) and a HIL, the EQE is reduced, and the like, making the carrier balance problematically poor.

Solution to Problem

A light-emitting element according to an aspect of the disclosure includes a first electrode; a second electrode facing the first electrode; a light-emitting layer including a phosphor, the light-emitting layer being provided between the first electrode and the second electrode; and at least one function layer including at least one type of solvent with high polarity and low vapor pressure, the at least one function layer being provided between the first electrode and the light-emitting layer.

The light-emitting element according to an aspect of the disclosure may have a configuration wherein the at least one function layer further includes nanoparticles of a metal compound including at least one selected from oxygen, a hydroxyl group, carbon, and nitrogen.

The light-emitting element according to an aspect of the disclosure may have a configuration wherein a metal element included in the metal compound is at least one selected from Ni, Mg, Al, Zn, Fe, Sn, Cu, Cr, Ta, Mo, W, and Re.

The light-emitting element according to an aspect of the disclosure may have a configuration wherein the at least one function layer is a hole injection layer.

The light-emitting element according to an aspect of the disclosure may have a configuration wherein the metal element is Ni.

The light-emitting element according to an aspect of the disclosure may have a configuration wherein the first electrode is an anode.

The light-emitting element according to an aspect of the disclosure may have a configuration wherein the metal compound is nickel oxide.

The light-emitting element according to an aspect of the disclosure may have a configuration wherein a thickness of the at least one function layer is from 1 nm to 50 nm.

The light-emitting element according to an aspect of the disclosure may have a configuration wherein a dipole moment indicating polarity of the solvent included in the at least one function layer is greater than 1.94 D.

The light-emitting element according to an aspect of the disclosure may have a configuration wherein a dipole moment indicating polarity of the solvent included in the at least one function layer is 2 D or greater.

The light-emitting element according to an aspect of the disclosure may have a configuration wherein vapor pressure of the solvent included in the at least one function layer is less than 3200 Pa.

The light-emitting element according to an aspect of the disclosure may have a configuration wherein vapor pressure of the solvent included in the at least one function layer is less than 1000 Pa.

The light-emitting element according to an aspect of the disclosure may have a configuration wherein the solvent included in the at least one function layer is at least one selected from propylene carbonate, ethylene carbonate, 1,2-dimethoxyethane, dimethyl carbonate, diethyl carbonate, mercaptopropionic acid, cysteamine, and mercaptoacetic acid.

A display device according to an aspect of the disclosure may include the light-emitting element described above.

Ink according to an aspect of the disclosure includes nanoparticles of a metal compound including at least one selected from oxygen, a hydroxyl group, carbon, and nitrogen; and at least one type of solvent with high polarity and low vapor pressure.

A light-emitting element and a display device according to an aspect of the disclosure may be manufactured using the ink described above.

A method for manufacturing the light-emitting element according to an aspect of the disclosure includes forming the at least one function layer by dropping or printing ink including nanoparticles of a metal compound including at least one selected from oxygen, a hydroxyl group, carbon, and nitrogen and at least one type of solvent with high polarity and low vapor pressure.

A light-emitting element according to an aspect of the disclosure includes an anode; a cathode facing the anode; a light-emitting layer including quantum dots, the light-emitting layer being provided between the anode and the cathode; and at least one function layer provided between the anode and the light-emitting layer, wherein the at least one function layer includes nanoparticles, and an average particle diameter of the nanoparticles included in the at least one function layer is less than an average particle diameter of the quantum dots included in the light-emitting layer.

The light-emitting element according to an aspect of the disclosure may have a configuration wherein an average particle diameter of the nanoparticles included in the at least one function layer is in a range from 40% to 100% of an average particle diameter of the quantum dots included in the light-emitting layer.

The light-emitting element according to an aspect of the disclosure may have a configuration wherein an average particle diameter of the nanoparticles included in the at least one function layer is in a range from 60% to 90% of an average particle diameter of the quantum dots included in the light-emitting layer.

The light-emitting element according to an aspect of the disclosure may have a configuration wherein a modal value of particle diameter of the nanoparticles included in the at least one function layer is less than an average value or a median value of particle diameter of the nanoparticles.

The light-emitting element according to an aspect of the disclosure may have a configuration wherein a particle diameter of the nanoparticles included in the at least one function layer is in a range from −4 nm to +50 nm with respect to an average particle diameter of the nanoparticles.

The light-emitting element according to an aspect of the disclosure may have a configuration wherein a particle diameter distribution of the nanoparticles satisfies $3*P\sigma<(Pmax-Pmin)$, where Pmax is a maximum particle diameter of the nanoparticles included in the at least one function layer, Pmin is a minimum particle diameter of the nanoparticles, and Pσ is a standard deviation of particle diameters of the nanoparticles. In the disclosure, "*" is used as an operation symbol indicating integration.

The light-emitting element according to an aspect of the disclosure may have a configuration wherein $Q\sigma/Qa>P\sigma/Pa$ is satisfied, where Pa is an average particle diameter of the nanoparticles included in the at least one function layer, Pσ is a standard deviation of particle diameters of the nanoparticles, Qa is an average particle diameter of the quantum dots included in the light-emitting layer, and Qσ is a standard deviation of the quantum dots.

The light-emitting element according to an aspect of the disclosure may have a configuration wherein the nanoparticles included in the at least one function layer include metal oxide.

The light-emitting element according to an aspect of the disclosure may have a configuration wherein the nanoparticles included in the at least one function layer include at least one metal element selected from Ni, Mg, Al, Zn, Fe, Sn, Cu, Cr, Ta, Mo, W, and Re.

The light-emitting element according to an aspect of the disclosure may have a configuration wherein the metal element included in the at least one function layer includes Ni, Ni included in the at least one function layer forms a compound, and the compound includes at least one selected from oxygen, a hydroxyl group, carbon, and nitrogen and includes at least one selected from nickel (I) oxide, nickel (II) oxide, nickel (III) oxide, nickel hydroxide, nickel nitrate, and nickel carbonate.

The light-emitting element according to an aspect of the disclosure may have a configuration wherein Ni included in the at least one function layer includes Ni having at least two types of valences.

The light-emitting element according to an aspect of the disclosure may have a configuration wherein the nanoparticles included in the at least one function layer are substantially spherical bodies or spheroids.

The light-emitting element according to an aspect of the disclosure may have a configuration wherein the at least one function layer includes a hole transport layer, the hole transport layer includes a compound including a C—H bond at a part of the molecular structure, and the thickness of the hole transport layer is from 1 nm to 50 nm.

The light-emitting element according to an aspect of the disclosure may have a configuration wherein the at least one function layer includes a hole injection layer, and the thickness of the hole injection layer is from 1 nm to 50 nm.

The light-emitting element according to an aspect of the disclosure may have a configuration wherein the at least one function layer includes a hole transport layer and a hole injection layer, and the hole transport layer is formed following the surface of the hole injection layer.

The light-emitting element according to an aspect of the disclosure may have a configuration wherein the average particle diameter of the nanoparticles included in the at least one function layer and the average particle diameter of the quantum dots included in the light-emitting layer are determined by the nanoparticles and the quantum dots observed in a range from 200 μm to 1000 μm in terms of width at any position in a cross-sectional photograph of the at least one function layer and the light-emitting layer.

The light-emitting element according to an aspect of the disclosure may have a configuration wherein the average particle diameter of the nanoparticles included in the at least one function layer means the average value of particle diameters of the nanoparticles observed in a range from 200 μm to 1000 μm in terms of width at any position in a cross-sectional photograph of the at least one function layer.

The light-emitting element according to an aspect of the disclosure includes an anode; a cathode facing the anode; a light-emitting layer including quantum dots, the light-emitting layer being provided between the anode and the cathode; a hole injection layer and a hole transport layer provided in this order from the anode side between the anode and the light-emitting layer; and a monolayer film provided between the hole injection layer and the hole transport layer.

The light-emitting element according to an aspect of the disclosure may have a configuration wherein the hole injection layer includes nanoparticles made from an inorganic material.

The light-emitting element according to an aspect of the disclosure may have a configuration wherein the hole injection layer includes a compound including a metal element, the compound includes at least one selected from Ni, Mg, Al, Zn, Fe, Sn, Cu, Cr, Ta, Mo, W, and Re, and the compound includes at least one type of metal oxide.

The light-emitting element according to an aspect of the disclosure may have a configuration wherein the metal element included in the hole injection layer includes Ni, Ni included in the hole injection layer forms a compound, and the compound includes at least one selected from oxygen, a hydroxyl group, carbon, and nitrogen and includes at least one selected from nickel (I) oxide, nickel (II) oxide, nickel (III) oxide, nickel hydroxide, nickel nitrate, and nickel carbonate.

The light-emitting element according to an aspect of the disclosure may have a configuration wherein Ni included in the hole injection layer includes Ni having at least two types of valences.

The light-emitting element according to an aspect of the disclosure may have a configuration wherein the nanoparticles included in the hole injection layer are substantially spherical bodies or spheroids.

The light-emitting element according to an aspect of the disclosure may have a configuration wherein molecules included in the monolayer film have hole transport properties.

The light-emitting element according to an aspect of the disclosure may have a configuration wherein molecules included in the monolayer film include a functional group at one end.

The light-emitting element according to an aspect of the disclosure may have a configuration wherein the molecules included in the monolayer film include a functional group, and the molecules include at least one molecule selected from R—SH, RS—SR', R—RSCN, R—SeH, R—TeH, RSe—SeR', R—NC, R—NCO, R—$SiH_3$, R—$Si(CH_3)_2H$, R—$Si(CH_3)_3$, R—COOH, dye-COOH, R—$PO_3H_2$, RO—$PO_3H_2$, R—$SiX_2$[X═Cl, $OCH_3$, $OC_2H_5$], R—$NH_2$, R—OH, $[R—C(O)O]_2$, R—CH═$CH_2$, R—C═CH, R—$MgBr_2$, R—Li, Ar—$N_2^+X^-$, and R—BrR—CH═$CH_2$, where R and R' represent the functional group.

The light-emitting element according to an aspect of the disclosure may have a configuration wherein the monolayer film includes at least one selected from MeO-2PACz, BA-$CF_3$, 2PACz, and Me-4PACz.

The light-emitting element according to an aspect of the disclosure may have a configuration wherein the monolayer film is only provided on a side face of the hole injection layer facing the light-emitting layer.

The light-emitting element according to an aspect of the disclosure may have a configuration wherein, in the monolayer film, a plurality of the same molecules are arranged adjacent to one another.

The light-emitting element according to an aspect of the disclosure may have a configuration wherein the hole transport layer includes a compound including a C—H bond at a part of the molecular structure, and the thickness of the hole transport layer is from 1 nm to 50 nm.

The light-emitting element according to an aspect of the disclosure may have a configuration wherein the thickness of the hole injection layer is from 1 nm to 50 nm.

Advantageous Effects of Disclosure

According to an aspect of the disclosure, a QLED having excellent light-emission characteristics and reliability can be realized.

DESCRIPTION OF EMBODIMENTS

First Embodiment

Outline of Display Device

Figure 1:
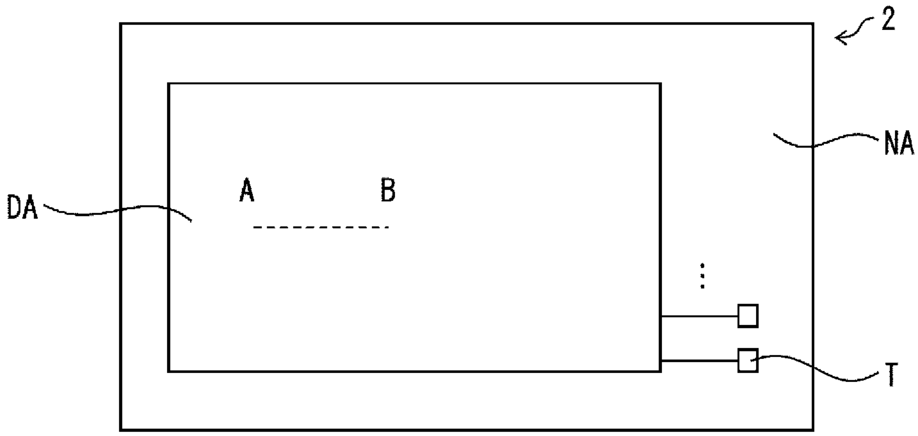
FIG. 1 is a plan view illustrating an example of a schematic configuration of a display device according to an embodiment of the disclosure.

FIG. 1 is a plan view illustrating an example of a schematic configuration of a display device 2 according to an embodiment of the disclosure.

As illustrated in FIG. 1, the display device 2 according to the disclosure includes a display region DA that performs display by the extraction of light emitted from the light-emitting elements described below, and a frame region NA surrounding a periphery of the display region DA. In the frame region NA, a terminal T is formed with a signal for driving each light-emitting element of the display device 2 as an input.

Figure 2:
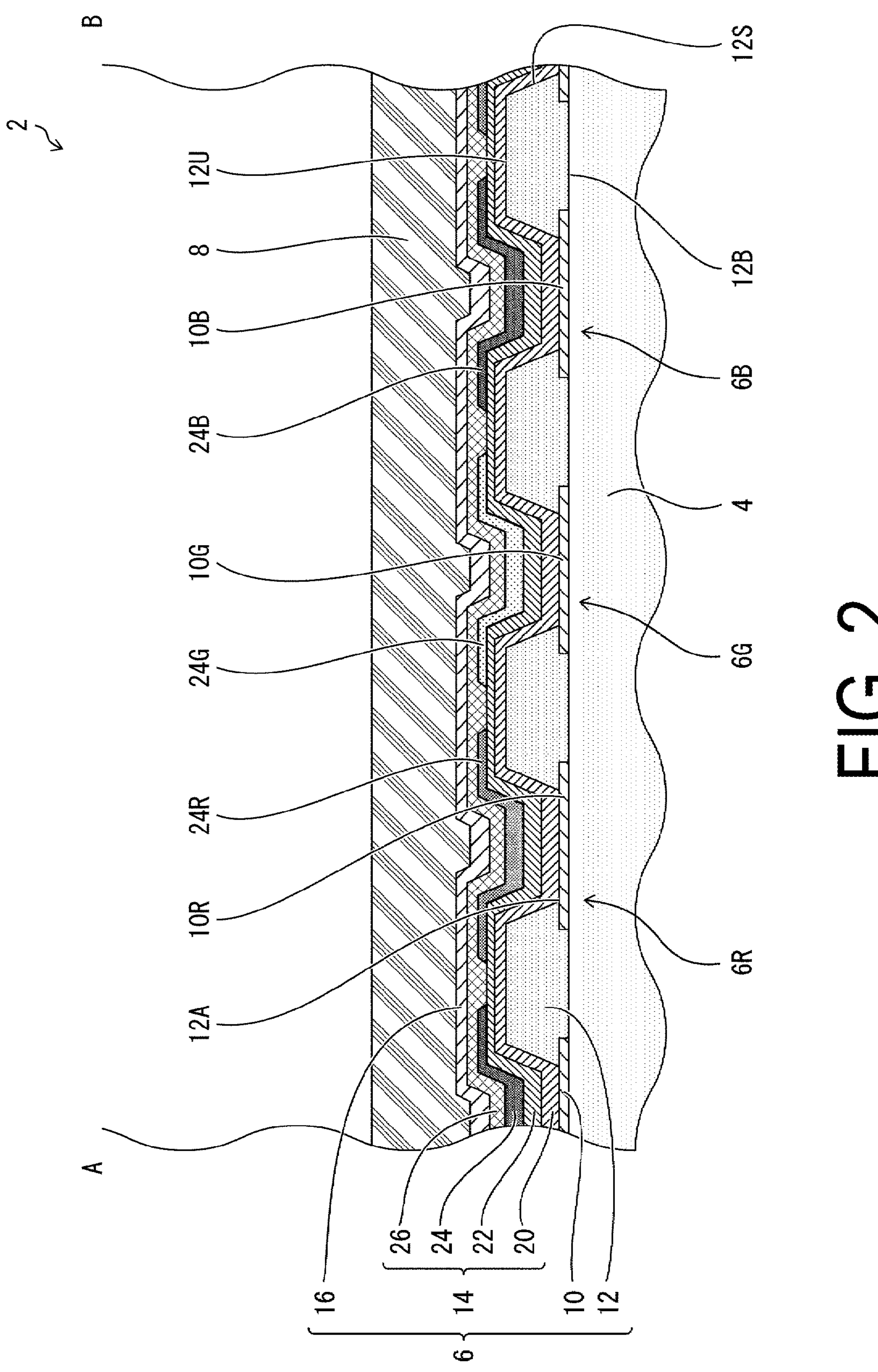
FIG. 2 is a cross-sectional view illustrating an example of a schematic configuration of a display region illustrated in FIG. 1.

FIG. 2 is a cross-sectional view illustrating an example of a schematic configuration of the display region DA illustrated in FIG. 1. Note that FIG. 3 corresponds to a cross-sectional view taken along line A-B in FIG. 1.

In the display region DA, the display device 2 according to the present embodiment includes a plurality of electroluminescent elements. FIG. 2 illustrates, of the plurality of electroluminescent elements in the display device 2, a red light-emitting element 6R, a green light-emitting element 6G, and a blue light-emitting element 6B. Unless otherwise specified in the disclosure, "light-emitting element" refers to any one of the red light-emitting element 6R, the green light-emitting element 6G, and the blue light-emitting element 6B.

As illustrated in FIG. 2, the display device 2 includes a substrate 4, a light-emitting element layer 6 above the substrate 4, and a sealing layer 8 covering the light-emitting element layer 6.

Substrate

The substrate 4 includes a support substrate. The substrate 4 includes a thin film transistor layer (TFT layer) in which a circuit element such as a thin film transistor (TFT) is provided above the support substrate. The substrate 4 may further include additional components such as a barrier layer. The barrier layer reduces the amount of moisture, oxygen, and the like entering into the light-emitting element layer 6 from the outside of the support substrate.

The support substrate may be a non-flexible substrate made of quartz, glass, or the like or a flexible substrate made of a resin film or a resin sheet. A quartz substrate and a glass substrate are preferable because they have high optical transparency and high gas shielding properties. From the viewpoint of optical transparency and gas shielding properties, the material of the resin film is preferably a methacrylic resin represented by polymethyl methacrylate (PMMA); a polyester resin represented by polyethylene terephthalate (PET), polyethylene naphthalate (PEN), and polybutylene naphthalate (PBN); a polycarbonate resin; or the like.

Light-Emitting Element Layer

The light-emitting element layer 6 is a layer including light-emitting elements.

The light-emitting element layer 6 includes an anode 10 (first electrode) above the substrate 4, a cathode 16 (second electrode) facing the anode 10, a bank 12, and an active layer 14 provided between the anode 10 and the cathode 16. The active layer 14 includes a hole injection layer 20, a hole transport layer 22, a light-emitting layer 24, and an electron transport layer 26 in this order from the anode 10 side. The active layer 14 is also referred to as an electroluminescence layer (EL layer).

In the disclosure, the direction from the light-emitting layer 24 of the light-emitting element layer 6 toward the anode 10 is referred to as the "downward direction" or "below", and the direction from the light-emitting layer 24 toward the cathode 16 is referred to as the "upward direction" or "above".

Here, the anode 10 is individually formed for each light-emitting element. The anode 10 is provided in an island shape for each light-emitting element, that is, for each subpixel and is also referred to as a "pixel electrode". The anode 10 includes an anode 10R for the red light-emitting element 6R, an anode 10G for the green light-emitting element 6G, and an anode 10B for the blue light-emitting element 6B. On the other hand, the hole injection layer 20, the hole transport layer 22, the electron transport layer 26, and the cathode 16 are each formed in common with the plurality of light-emitting elements. The cathode 16 is also referred to as a "common electrode".

The bank 12 may be formed individually for each light-emitting element, but is preferably formed integrally with the plurality of light-emitting elements in order to achieve high definition for the display device 2. The bank 12 is formed such that at least a part of the bank 12 is adjoining or separated but adjacent to the anode 10 and is disposed above the anode 10 in a top view. In the disclosure, "adjoining" indicates a case of being adjacent to and being in contact, and "adjacent" indicates not only a case of being in contact but also being separated but adjacent.

The bank 12 is a protrusion formed at a peripheral portion of the light-emitting element and is not limited in terms of function. The bank 12 may be partially formed at the peripheral portion of the light-emitting element. The bank 12 may function independently or together with another component to perform any function other than providing unevenness.

For example, the bank 12 is preferably formed as a partition between adjacent light-emitting elements for electrically insulating the light-emitting elements from one another. In this case, the banks 12 have insulating properties, and the light-emitting element layer 6 is partitioned into the red light-emitting element 6R, the green light-emitting element 6G, and the blue light-emitting element 6B by the banks 12.

For example, the bank 12 is preferably formed as an edge cover covering the edge of the anode 10. Specifically, at least of part of the bank 12 is preferably formed in contact with an end face of the anode 10 or disposed above an end face of the anode 10 in a top view. The bank 12 includes a bottom face 12B on the substrate 4 side, an upper face 12U on the sealing layer 8 side, and a side face 12S between the bottom face 12B and the upper face 12U. The side face 12S includes an inclined side face and is also referred to as an "inclined face". However, the side face or the inclined face does not necessarily have to be a flat face and may include a plurality of flat faces or may include a curved face or be uneven. Hereinafter, for the sake of simplicity, only a case in which a part of the bank 12 is disposed above the anode 10 will be described. Based on this description, it should be easy for a person skilled in the art to understand other cases in which a part of the bank 12 is adjoining or adjacent to the anode 10.

The light-emitting layer 24 includes a red light-emitting layer 24R that emits red light, a green light-emitting layer 24G that emits green light, and a blue light-emitting layer 24B that emits blue light. The light-emitting layer 24 may be formed individually for each light-emitting element or may be formed in common with the plurality of light-emitting elements of the same color.

The light-emitting layer 24 is formed covering at least the corresponding anode 10 exposed from an opening 12A of the bank 12. When the hole transport layer 22 and the electron transport layer 26 come into contact with one another above or in the vicinity above the exposed region of the anode 10, an invalid current that does not contribute to light emission of the light-emitting layer 24 flows through the contact site. Thus, the light-emitting layer 24 preferably further covers a part of the side face 12S of the bank 12 (specifically, a part close to the contour of the corresponding opening 12A).

In the configuration illustrated in FIG. 2, the hole transport layer 22 is in direct contact with the electron transport layer 26 above the upper face 12U of the bank 12. Typically, an invalid current flows when the hole transport layer 22 and the electron transport layer 26 are in direct contact, but in the disclosure, this contact is separated away from the exposed region of the anode 10, and thus an invalid current is suppressed. This is because the electrical resistivity of the charge transport layer and/or the charge injection layer is significantly higher than the electrical resistivity of a normal metal. Because of the high electrical resistance value of the path from anode 10 through hole transport layer 22 and/or the electron transport layer 26 to the contact site above the upper face 12U of the bank 12, the invalid current flowing through the path according to the disclosure can be negligibly small or substantially 0. In order to minimize the contact site above the upper face 12U of the bank 12, the gap between adjacent light-emitting layers 24 is preferably small.

In the disclosure, "blue light" refers to, for example, light having a light emission central wavelength in a wavelength band from 400 nm to 500 nm. Also, "green light" refers to, for example, light having a light emission central wavelength in a wavelength band from greater than 500 nm to 600 nm. Also, "red light" refers to, for example, light having a light emission central wavelength in a wavelength band of greater than 600 nm to 780 nm.

Note that the light-emitting element layer 6 according to the present embodiment is not limited to the configuration described above, and may further include an additional layer between the anode 10 and the cathode 16. For example, the light-emitting element layer 6 may further include an electron injection layer between the electron transport layer 26 and the cathode 16. Also, the light-emitting layer 24 may emit light of two colors or less or may emit light of four colors or more.

The anode 10 and the cathode 16 include an electrically conductive material and at least one is a transparent electrode. In a case where the display device 2 is a single-sided display, the electrode located closer to the display surface from among the anode 10 and the cathode 16 is the transparent electrode, and the electrode located farther from the display surface is a reflective electrode. In a case where the display device 2 is a double-sided display, both the anode 10 and the cathode 16 are transparent electrodes. The transparent electrode can be made of an electrically conductive material with optical transparency. The reflective electrode can be made of conductive material with light reflectivity or can be made of a layered body including a conductive material with optical transparency and conductive material with light reflectivity.

Electrically conductive material with optical transparency includes indium tin oxide (ITO), indium zinc oxide (IZO), tin oxide (SnO2), fluorine-doped tin oxide (FTO), and the like. Since these materials have a high transmittance with respect to visible light, the luminous efficiency of the light-emitting elements is improved. As the conductive material with light reflectivity, aluminum (Al), silver (Ag), copper (Cu), gold (Au), or the like can be used. Since these materials have a high reflectivity with respect to visible light, the luminous efficiency of the light-emitting elements is improved. When conductive material with light reflectivity is thinly formed, the conductive material can be used as an optical transparent electrically conductive material with optical transparency.

The anode 10 supplies positive holes to the light-emitting layer 24, and the cathode 16 supplies electrons to the light-emitting layer 24. The anode 10 is provided facing the cathode 16.

The hole injection layer 20 includes nanoparticles having hole transport properties and a solvent having high polarity and low vapor pressure and has a function of injecting positive holes from the anode 10 to the hole transport layer 22 or the light-emitting layer 24. The hole transport layer 22 includes a material having hole transport properties and has a function of transporting positive holes from the hole injection layer 20 or the anode 10 to the light-emitting layer 24. At least one of the hole injection layer 20 and the hole transport layer 22 preferably has a function of inhibiting the transport of electrons from the light-emitting layer 24 to the anode 10.

The hole injection layer 20 will be described in detail below.

The hole transport material used in the hole transport layer 22 can be appropriately selected from materials generally used in the relevant field.

Examples of organic hole transport materials include, for example, polyethylene dioxythiophene doped with polystyrene sulfonate (PEDOT:PSS), 4,4',4"-tris(9-carbazoyl)triphenylamine (TCTA), 4,4'-bis[N-(1-naphthyl)-N-phenyl-amino]-biphenyl (NPB), zinc phthalocyanine (ZnPC), di[4-(N,N-ditolylamino)phenyl] cyclohexane (TAPC), 4,4'-bis (carbazol-9-yl) biphenyl (CBP), 2,3,6,7,10,11-hexacyano-1,4,5,8,9,12-hexaazatriphenylene (HATCN), poly(N-vinylcarbazole) (PVK), poly(2,7-(9,9-di-n-octylfluorene)-(1,4-phenylene-((4-sec-butylphenyl)imino)-1,4-phenylene (TFB), poly(triphenylamine) derivative (Poly-TPD), and the like. Among these, a tetracyano compound such as TFB, a carbazole derivative such as PVK, and a triarylamine derivative such as Poly-TPD are preferable. For example, a compound having a chain structure in which a single bond and a double bond are alternately bonded with one another with a C—H bond or the like as the smallest unit tends to easily exhibit electrical conductivity. Thus, the hole transport material used for the hole transport layer 22 preferably includes a compound having C—H in a part of the molecular structure.

An example of an inorganic hole transport material includes, for example, a material that includes one or more selected from the group consisting of a metal compound including at least one or more from oxygen, nitrogen, and carbon and includes one or more from among Zn, Cr, Ni, Ti, Nb, Al, Si, Mg, Ta, Hf, Zr, Y, La, Sr, and W. Among these, as the inorganic hole transport material, oxides including one or more from among Zn, Cr, Ni, Ti, Nb, Al, Si, Mg, Ta, Hf, Zr, Y, La, and Sr are preferable, and at least one selected from NiO, MgO, MgNiO, LaNiO3, CuO, and Cu2O is more preferable. Furthermore, an example of a preferable hole transport material includes a material such as CuSCN in which a CN group, an SCN group, or a SeCN group are bonded to a metal. These materials may be nanoparticles.

In the disclosure, "nanoparticles" means particles having a maximum width in the nano order of magnitude (less than 1000 nm). The shape of the nanoparticle is not particularly limited as long as it is within a range satisfying the maximum width, and the shape is not limited to a spherical three-dimensional shape (circular cross-sectional shape). The shape may be, for example, a polygonal cross-sectional shape, a rod-shaped three-dimensional shape, a branch-shaped three-dimensional shape, or a three-dimensional shape having unevenness on the surface thereof, or a combination thereof.

Inorganic materials have a higher chemical stability than organic materials and can improve the reliability of a product such as a light-emitting element or a display device including light-emitting elements. Thus, the hole transport layer 22 preferably includes inorganic hole transport material. Furthermore, the inorganic hole transport material is preferably a metal oxide, and in this case, the chemical stability is further increased. In this manner, an inorganic material being preferable and a metal oxide being more preferable is the same for all of the elements, materials, and layers that form the active layer 14.

The electron transport layer 26 includes a material having electron transport properties and has a function of transporting electrons from the cathode 16 to the light-emitting layer 24. The electron transport layer 26 preferably has a function of inhibiting the transport of positive holes from the light-emitting layer 24 to the cathode 16.

Examples of an organic electron transport material suitable for the electron transport layer 26 include compounds and complexes including one or more nitrogen-containing heterocycles such as oxadiazole ring, triazole ring, triazine ring, quinoline ring, phenanthroline ring, pyrimidine ring, pyridine ring, imidazole ring, and carbazole ring. Specific examples include 1,10-phenanthroline derivatives such as bathocuproine and bathophenanthroline; benzimidazole derivatives such as 1,3,5-tris(N-phenylbenzimidazol-2-yl) benzene (TPBI); metal complexes such as (tris(8-quinolinato)aluminium) complex (Alq3), bis(10-benzoquinolinolato) beryllium complex, 8-hydroxyquinoline Al complex, bis(2-methyl-8-quinolinato)-4-phenylphenolate aluminum; and 4,4'-bis(carbazole) biphenyl. Other examples thereof include aromatic boron compounds, aromatic silane compounds, aromatic phosphine compounds such as phenyldi (1-pyrenyl)phosphine, bathophenanthroline, bathocuproine, 2,2',2"-(1,3,5-benzenetriyl)-tris(1-phenyl-1-H-benzimidazole) (TPBI), nitrogen-including heterocyclic compounds such as triazine derivatives.

Another example of an organic electron transport material suitable for the electron transport layer 26 includes a compound having a paraphenylene vinylene backbone, for example. Specific examples include polyparaphenylene vinylene (PPV) compounds such as poly(2-2'-ethylhexoxy)-5-methoxy-1,4-phenylene vinylene (POPh-PPV).

An example of an inorganic electron transport material suitable for the electron transport layer 26 includes an oxide including one or more of Zn, Ni, Cr, Mg, Li, Ti, W, Mo, In, and Ga. Among these, an oxide that tends to shift to the oxygen deficiency side on the basis of the stoichiometric composition is preferable. Examples thereof include zinc oxide (ZnO), magnesium zinc oxide (MgZnO), titanium oxide (TiO2), strontium oxide (SrTiO3), and the like. These materials may be nanoparticles.

As described above, inorganic materials have a higher chemical stability than organic materials and can improve the reliability of a product. Thus, the electron transport layer 26 preferably includes inorganic electron transport material. Furthermore, the inorganic electron transport material is preferably a metal oxide, and in this case, the chemical stability is further increased. A zinc oxide material is most preferable.

The transparent electrode, the hole injection layer 20, the hole transport layer 22, and the electron transport layer 26 transmit light of a wavelength band used for display by the display device 2.

The light-emitting layer 24 is a layer that emits light when the recombination of positive holes from the anode 10 and electrons from the cathode 16 cause the luminescent bodies (phosphors) to excite and then return to a ground state. When a voltage between the anode 10 and the cathode 16 or a current is applied, recombination occurs in the light-emitting layer 24 and light is emitted. The light-emitting layer 24 includes quantum dots as the luminescent bodies.

A quantum dot is a dot having a maximum width of 100 nm or less. The shape of the quantum dot is not particularly limited as long as it is within a range satisfying the maximum width, and the shape is not limited to a spherical three-dimensional shape (circular cross-sectional shape). The shape of the quantum dot may be, for example, a polygonal cross-sectional shape, a rod-shaped three-dimensional shape, a branch-shaped three-dimensional shape, or a three-dimensional shape having unevenness on the surface thereof, or a combination thereof. In the present example, for example, quantum dots are semiconductor fine particles having a particle size equal to or less than 100 nm, and can include a group II-VI semiconductor compound such as MgS, MgSe, MgTe, CaS, CaSe, CaTe, SrS, SrSe, SrTe, BaS, BaSe, BaTe, ZnS, ZnSe, ZnTe, CdS, CdSe, CdTe, HgS, HgSe, and HgTe, and/or a crystal of a group III-V semiconductor compound such as GaAs, GaP, InN, InAs, InP, and InSb, and/or a crystal of a group IV semiconductor compound such as Si and Ge. Furthermore, quantum dots may have, for example, a core-shell structure in which such a semiconductor crystal described above is a core and a shell material having a high band gap is coated over the core. Furthermore, the quantum dot may include a ligand adsorbed (coordinated) on the surface of the quantum dot. Note that the shell is not necessarily required to completely cover the core, and it is sufficient that the shell is formed at a part above the core. Since quantum dots and a compound for forming the ligand are included in the light-emitting layer 24, the compound can be considered a ligand adsorbed (coordinated) on the surface of the quantum dots.

In a case where the bank 12 has insulating properties, the bank 12 may include an insulating material. The bank 12 may include, for example, polyimide resins, acrylic resins, novolac resins, fluorene resins, or the like. The bank 12 can be formed by patterning a photosensitive resin material using, for example, a photolithography technique. The photosensitive resin may be negative or positive.

The sealing layer 8 covers the light-emitting element layer 6 and seals each light-emitting element included in the display device 2. The sealing layer 8 reduces permeation of moisture, oxygen, and the like into the light-emitting element layer 6 and the like from the outside the display device 2 on the sealing layer 8 side. The sealing layer may have, for example, a layered structure of an inorganic sealing film made of an inorganic material and an organic sealing film made of an organic material.

The inorganic sealing film is formed by chemical vapor deposition (CVD) and constituted by a silicon oxide film, a silicon nitride film, a silicon oxynitride film, or a layered film of these, for example. The organic sealing film is constituted by, for example, a coatable resin material including polyimide.

Hole Injection Layer

Figure 3:
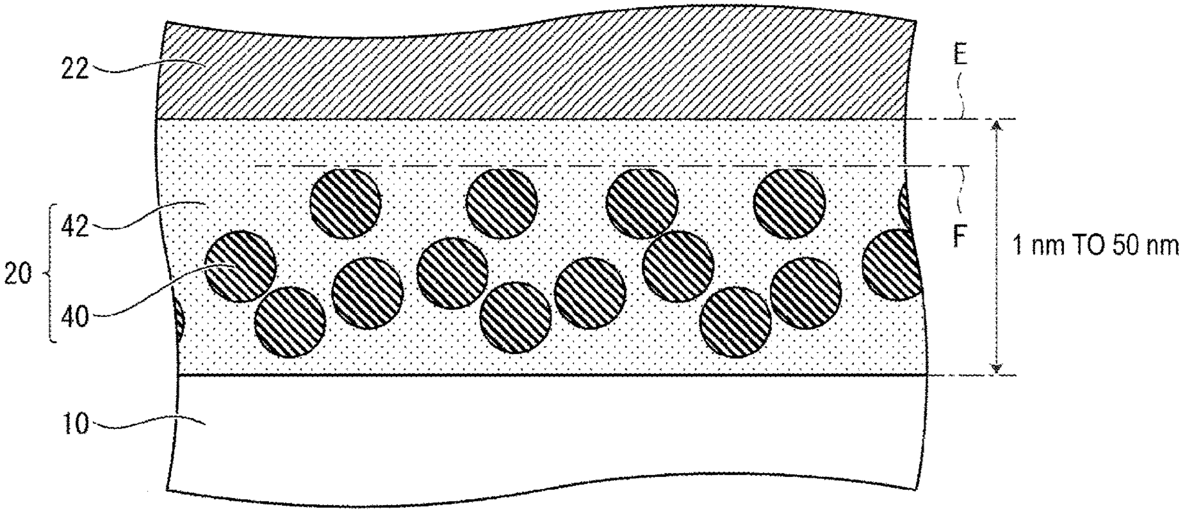
FIG. 3 is a schematic view illustrating an example of a schematic configuration of a hole injection layer according to the embodiment of the disclosure.
Figure 4:
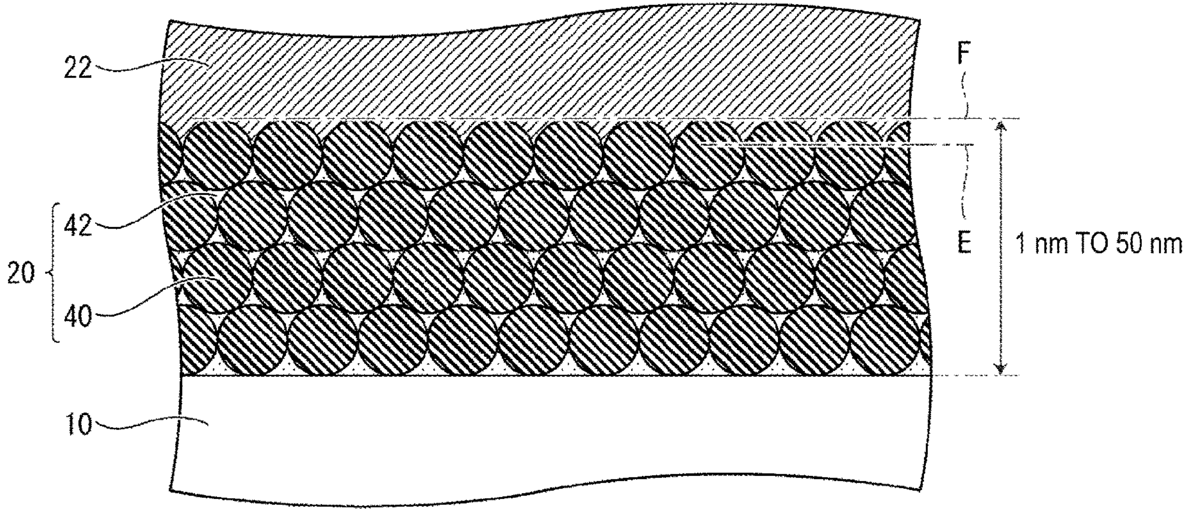
FIG. 4 is a schematic view illustrating another example of a schematic configuration of a hole injection layer according to the embodiment of the disclosure.

FIG. 3 is a schematic view illustrating an example of a schematic configuration of the hole injection layer 20 according to the present embodiment. FIG. 4 is a schematic view illustrating another example of a schematic configuration of the hole injection layer 20 according to the present embodiment.

As illustrated in FIGS. 3 and 4, the hole injection layer 20 according to the present embodiment includes nanoparticles 40 and a solvent 42. The hole injection layer 20 preferably does not include ligands coordinated to the nanoparticles 40. The desorption or the like of the ligands from the nanoparticles 40 may lead to the performance of the hole injection layer 20 deteriorating. In addition, an organic ligand may deteriorate due to an electrochemical reaction causing the performance of the hole injection layer 20 to be deteriorated.

In the region corresponding to the opening 12A of the bank 12, the hole injection layer 20 is preferably 1 nm or greater at the thinnest portion and 50 nm or less at the thickest portion. This is because the anode 10 and the hole transport layer 22 are more likely to come into direct contact with one another when the thickness is less than 1 nm. In the case of direct contact, hole injection from the hole injection layer 20 to the hole transport layer 22 may be inhibited or parallel resistance between the anode 10 and the cathode 16 may be reduced. Accordingly, the leakage current increases and the EQE decreases. In a case where the thickness is thicker than 50 nm, a large amount of uncontrollable aggregation of the nanoparticles 40 may occur in the hole injection layer 20. Here, the large amount of aggregation is an aggregation with a maximum width that is equal to or greater than the thickness of the light-emitting layer 24. In a case where a large aggregate is present in the hole injection layer 20, even if the large aggregate is present in only a part of the hole injection layer 20, forming the light-emitting layer 24 lamellarly directly above the large aggregate would likely cause the performance of the light-emitting layer 24 to be deteriorated.

The ratio of the nanoparticles 40 relative to the hole injection layer 20 may be appropriately selected. For example, as illustrated in FIG. 3, the ratio of the nanoparticles 40 may be small, and the nanoparticles 40 may be scattered in the solvent 42 (here, also meaning the solvent 42 before the solidifying process). That is, as illustrated in FIG. 3, level E of the upper face of the solvent 42 may be equal to or higher than level F of the uppermost portion of the nanoparticles 40. In addition, for example, as illustrated in FIG. 4, the ratio of the nanoparticles 40 may be large, and the solvent 42 may be filled into the gaps between the nanoparticles 40. That is, as illustrated in FIG. 4, level E of the upper face of the solvent 42 may be lower than level F of the uppermost portion of the nanoparticles 40. By appropriately selecting the temperature and time of the solidifying process, such as heating or cooling, in the layer forming method using ink, the upper face of the solvent 42 after the solidifying process can be formed in a lower direction than the upper face of the solvent 42 before the solidifying process.

The ratio of the nanoparticles 40 after the solidifying process is preferably from 10 mg/ml to 50 mg/ml in terms of the weight-to-volume ratio of the nanoparticles 40 to the hole injection layer 20 so as to not inhibit hole transport to the light-emitting layer 24 and so as to not cause a large amount of aggregation in the hole injection layer 20.

The nanoparticles 40 used in the hole injection layer 20 have hole transport properties. The nanoparticles 40 according to the present embodiment are preferably made of an inorganic material that can be dispersed in water or a solvent having a high polarity equal to or higher than that of water. Such an inorganic material is, for example, a metal compound including at least one selected from an oxygen atom, a hydroxyl group, a carbon atom, and a nitrogen atom. Since a metal compound has high electrochemical stability, it is beneficial for the light-emission characteristics and reliability of the light-emitting elements and the display device that the nanoparticles 40 are made of a metal compound. In particular, since a metal oxide tends to have a deeper valence band maximum and has a band structure suitable for hole injection to the light-emitting layer, the inorganic material with hole transport properties included in the nanoparticles 40 preferably includes a metal oxide.

In the disclosure, the conduction band minimum is hereinafter referred to as CBM, and the valence band maximum is hereinafter referred to as VBM. Furthermore, the absolute value of the difference between the vacuum level and the CBM can be rephrased as the electron affinity, and the absolute value of the difference between the vacuum level and the VBM can be rephrased as the ionization potential. "Deep" in the context of CBM or VBM means the corresponding electron affinity or ionization energy is large, "shallow" in the context of CBM or VBM means the corresponding electron affinity or ionization energy is small, and "depth" means the magnitude of corresponding electron affinity or ionization energy".

The metal compound used as the material of the nanoparticles 40 preferably includes, for example, one or more metal elements selected from the group consisting of nickel (Ni), magnesium (Mg), aluminum (Al), zinc (Zn), iron (Fe), tin (Sn), copper (Cu), chromium (Cr), tantalum (Ta), molybdenum (Mo), tungsten (W), and rhenium (Re). As the material of the nanoparticles 40, a metal compound including Ni is particularly preferable and specifically, for example, a metal compound including $Ni(OH)_2$, $Ni(NO_3)_2$, $NiCO_3$, $Ni_2O_3$, NiO, or $Ni_2O$ or a mixture including two or more selected from these is preferable. This is because the depth of the VBM of a nickel compound is suitable for hole injection to quantum dots that emits light in the visible light region.

"Nickel oxide" in the disclosure means a compound including nickel and oxygen. That is, nickel oxide includes in its meaning not only single element $Ni_2O_3$, single element NiO, and single element $Ni_2O$ having the same valence, but also a mixture including any two or more of $Ni_2O_3$, NiO, and $Ni_2O$ having different valences, a mixture including a nickel compound other than an oxide in addition to any one or more of $Ni_2O_3$, NiO, and $Ni_2O$, or a mixture including a metal compound other than a nickel compound in addition to any one or more of $Ni_2O_3$, NiO, and $Ni_2O$. "Nickel oxide" in the disclosure means mixtures that are produced and/or used in industry as nickel oxide.

Here, $Ni_2O$ is nickel (I) oxide, NiO is nickel (II) oxide, $Ni_2O_3$ is nickel (III) oxide, $Ni(OH)_2$ is nickel hydroxide, $Ni(NO_3)_2$ is nickel nitrate, and $NiCo_3$ is nickel carbonate.

The shape of the nanoparticles 40 is preferably a substantially spherical or substantially spheroidal because a three dimensionally isotropic shape is desirable for uniform dispersion in a solvent and uniform coatability.

The solvent 42 is preferably a solvent other than water. The solvent 42 may have a higher polarity than water and preferably has a lower vapor pressure than water. In addition, the solvent 42 is preferably highly electrochemically stable. Specifically, the boiling point of the solvent 42 at normal temperature and normal pressure is preferably higher than the upper limit of the operating environment temperature of at least the light-emitting element or the display device including the light-emitting element. For example, in a case where the upper limit of the operating environment temperature is 80° C., the boiling point of the solvent 42 is preferably sufficiently higher than 80° C. and more preferably approximately 200° C. or higher. The metal element used for the hole injection layer 20 may be a metal element having a catalytic action such as Ni. Thus, it is preferable that the decomposition temperature of the solvent 42 in an environment in which a metal oxide and/or active oxygen is present is higher than the upper limit of the operating environment temperature. The active oxygen includes OH radicals and the like.

Examples of such a solvent include a carbonate solvent, an ethoxy solvent, a thiol-carboxyl solvent, a thiol-amine solvent, a carboxyl-amine solvent, a ketone solvent, a nitrile solvent, a lactone solvent, and a mixture thereof. Specifically, the solvent having high polarity and low vapor pressure may include one or more selected from the group consisting of propylene carbonate, ethylene carbonate, 1,2-dimethoxyethane, dimethyl carbonate, diethyl carbonate, mercaptopropionic acid, cysteamine, and mercaptoacetic acid. Among these, ethylene carbonate having high fluidity at around normal temperature is suitable for the solvent 42. For example, the boiling point of ethylene carbonate at normal pressure is approximately 248° C., the decomposition temperature of ethylene carbonate in an environment in which a metal oxide or active oxygen is present is approximately 200° C., and ethylene carbonate has very high stability.

At normal temperature and normal pressure (approximately 20° C. and 1 atm), the dipole moment indicating the polarity of water is approximately 1.94 D, and the vapor pressure of water is approximately 3200 Pa. At normal temperature and normal pressure, the dipole moment indicating the polarity of ethylene carbonate is approximately 4.5 D, and the vapor pressure of ethylene carbonate is approximately 2.66 Pa. Accordingly, the dipole moment indicating the polarity of the solvent 42 at normal temperature and normal pressure is at least greater than approximately 1.94 D and preferably equal to or greater than approximately 2 D, equal to or greater than 3 D, equal to or greater than 4.5 D, and equal to or greater than 6D. Also, the vapor pressure of the solvent 42 at normal temperature and normal pressure is at least less than approximately 3200 Pa and preferably less than approximately 1000 Pa.

The high polarity solvent has the property of being miscible with various organic solvents. In addition, the low vapor pressure solvent is hard to volatilize. For these reasons, for the solution including the solvent 42, the characteristics related to printing such as the viscosity and the concentration can be easily adjusted, and the characteristics can be easily maintained over a long period of time. In addition, since the viscosity, the concentration, and the like are easily adjusted, the solvent 42 is suitable for making the nanoparticles 40 into ink. "Making into ink" in the disclosure refers to dispersing nanoparticles in a solvent.

Method for Manufacturing Display Device

Figure 5:
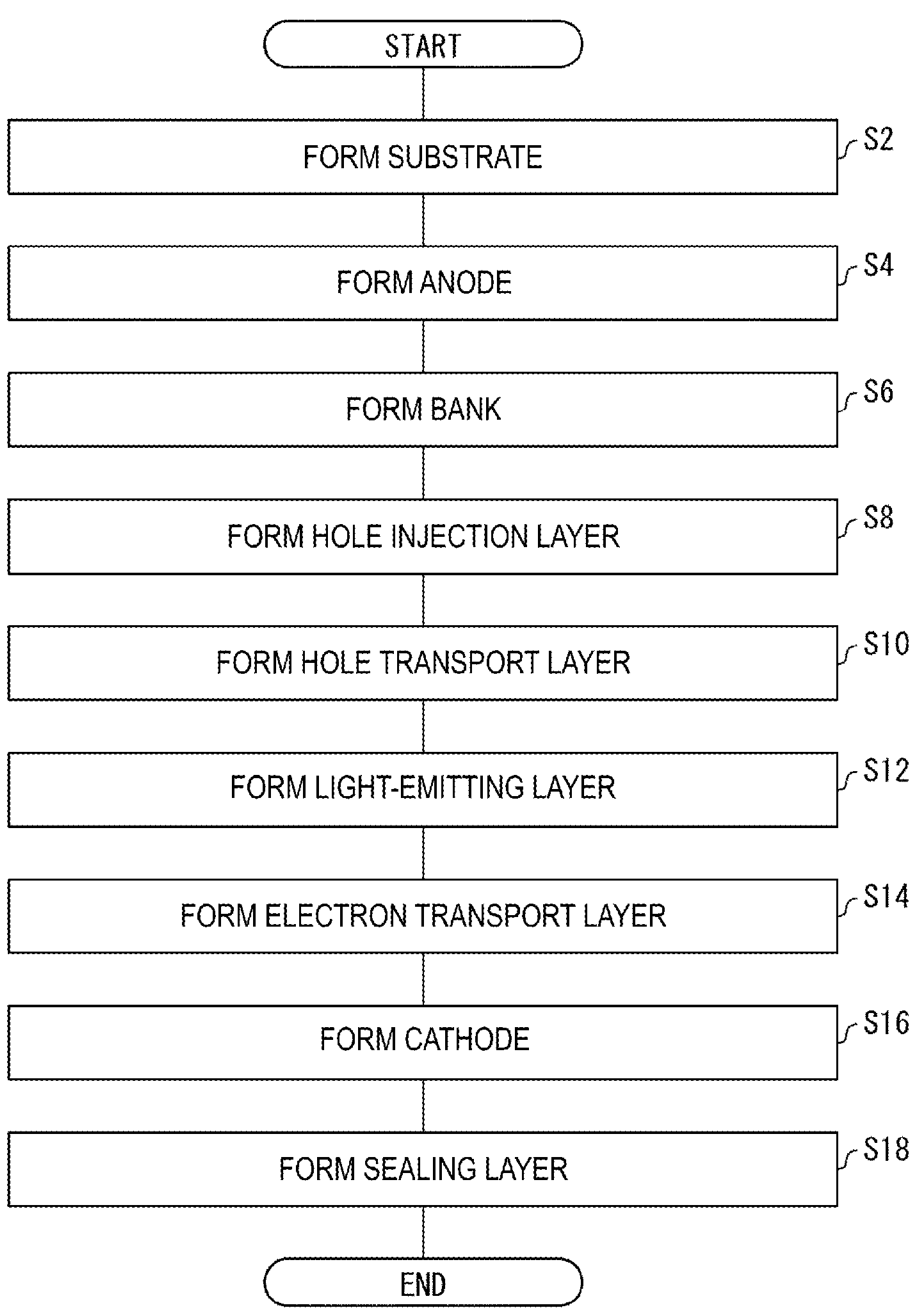
FIG. 5 is a schematic flow diagram illustrating an example of a method for manufacturing the display device according to the embodiment of the disclosure.

FIG. 5 is a schematic flow diagram illustrating an example of a method for manufacturing the display device 2 according to the present embodiment.

In the method for manufacturing the display device 2 according to the present embodiment, first, the substrate 4 is formed (step S2). The substrate 4 may be formed by, for example, forming, on a rigid glass substrate, a film base material and TFTs on the film base material, and then peeling the glass substrate from the film base material. The peeling of the glass substrate described above may be executed after formation of the light-emitting element layer 6 and the sealing layer 8 described below. Alternatively, the substrate 4 may be formed by, for example, forming the TFTs directly on a rigid glass substrate.

Next, the anode 10 is formed on the substrate 4 (step S4). The anode 10 may be formed by, for example, forming a thin film of a metal material by a sputtering method, a vacuum vapor deposition technique, or the like, and then patterning the thin film by dry etching or wet etching using a photoresist. Thus, the anode 10R, the anode 10G, and the anode 10B formed into island shapes on a subpixel-by-subpixel basis on the substrate 4 are obtained.

Next, the banks 12 are formed (step S6). In step S6, the banks 12 are formed by photolithography of a positive photosensitive resin. Specifically, for example, a positive photosensitive resin serving as the material of the banks 12 is applied to the upper faces of the substrate 4 and the anode 10. Next, a photomask having a light-transmitting portion at a position corresponding to each subpixel is placed above the applied photosensitive resin, and the photosensitive resin is irradiated with ultraviolet light or the like through the photomask. Then, the photosensitive resin irradiated with the ultraviolet light is cleaned with an appropriate developing solution. Thus, the banks 12 are formed between the positions corresponding to the subpixels on the substrate 4.

In general, as a distance between the photomask and an exposure target increases, an exposure area and an exposure intensity of the photomask in plan view tend to decrease. For this reason, when formed by photolithography using a positive-wo photosensitive resin, the banks 12 are narrowed gradually upwardly from the substrate 4 side. Accordingly, in step S6, the banks 12 are formed by applying, exposing, and developing the positive photosensitive resin, making it possible to form the banks 12 having the side faces 20S that are forwardly tapered faces.

Next, the hole injection layer 20 is formed (step S8). The formation of the hole injection layer 20 and the hole transport layer 22 will be described in detail below.

Next, the hole transport layer 22 is formed (step S10). To form the hole transport layer 22, for example, an organic hole transport material is dissolved in a solvent to obtain a second solution, the second solution is applied onto the hole injection layer 20, and the solvent is volatilized and removed by heating or the like to solidify the second solution. Here, because the meniscus effect causes a difference in film thickness in the hole injection layer 20, it is required that the wettability of the material solution of the hole transport layer 22 with respect to the hole injection layer 20 is high, or in other words that the contact angle of the material solution is less than 90 degrees. The hole transport layer 22 may be formed by another method such as a vacuum vapor deposition technique or a sputtering method.

Next, the light-emitting layer 24 is formed (step S12). The light-emitting layer 24 may be formed by any method. For example, the red light-emitting layer 24R may be formed and patterned by an ink-jet method. In addition, for example, the red light-emitting layer 24R may be formed by a coating method using a spin coater or the like or may be patterned by a photolithography technique. Furthermore, for example, the red light-emitting layer 24R may be formed and patterned by vapor deposition using a fine metal mask (FMM).

Next, the electron transport layer 26 is formed (step S14). The electron transport layer 26 is formed by, for example, dissolving an electron transport material in a solvent to obtain a material solution, applying the material solution on the light-emitting layer 24 and the hole transport layer 22, and solidifying the material solution.

The electron transport layer 26 may be formed by another method such as a vacuum vapor deposition technique or a sputtering method.

Next, the cathode 16 is formed (step S16). The cathode 16 may be formed by, for example, forming a thin film of a metal material in common to the subpixels by a vacuum vapor deposition technique, a sputtering method, or the like. With the above, formation of the light-emitting element layer 6 is completed.

Next, the sealing layer 8 is formed (step S18). In a case in which the sealing layer 8 includes an organic sealing film, the organic sealing film may be formed by applying an organic sealing material. Further, in a case in which the sealing layer 8 includes an inorganic sealing film, the inorganic sealing film may be formed by CVD or the like. Thus, the sealing layer 8 that seals the light-emitting element layer 6 is formed.

Then, peeling of the glass substrate, bonding of the function film, and the like are performed as necessary, and the manufacturing of the display device 2 is completed. Examples of the function film include a polarizer film, a sensor film having a touch sensor panel function, a protection film, and an anti-reflection film.

Formation of Hole Injection Layer

Figure 6:
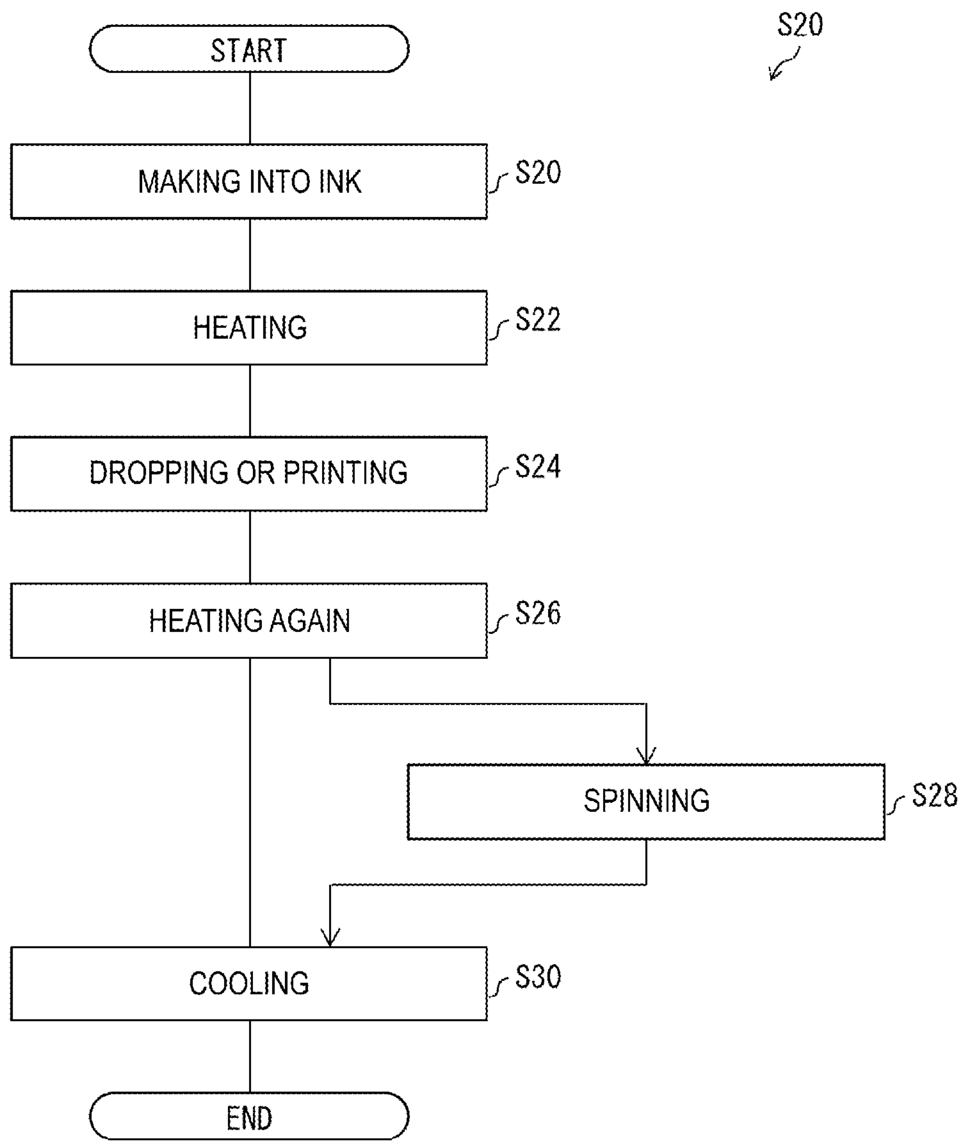
FIG. 6 is a schematic flow diagram illustrating an example of a formation process for the hole injection layer according to the embodiment of the disclosure.

FIG. 6 is a schematic flow diagram illustrating an example of a formation process for the hole injection layer 20 according to the present embodiment.

Figure 7:
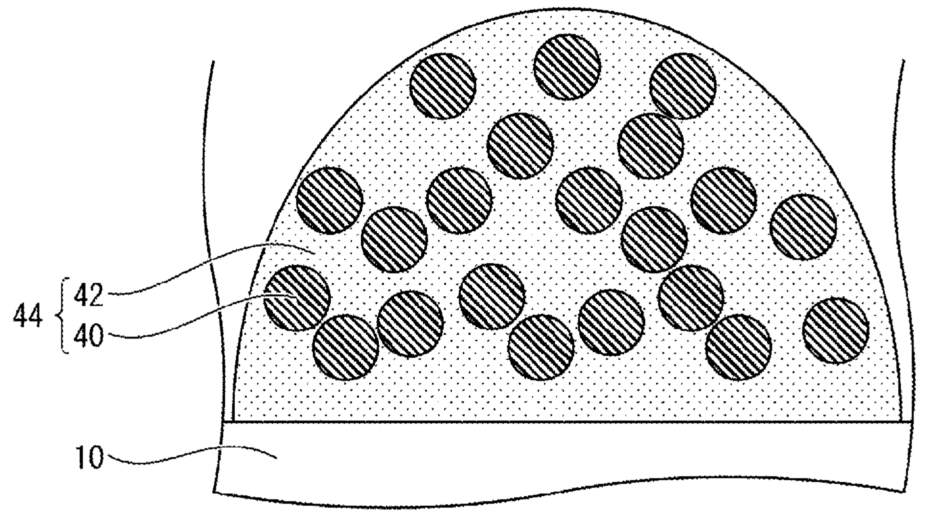
FIG. 7 is a schematic process diagram illustrating an example of a formation process for the hole injection layer according to the embodiment of the disclosure.

FIG. 7 is a schematic process diagram illustrating an example of a formation process for the hole injection layer 20 according to the present embodiment.

As illustrated in FIG. 6, in step S8, first, the nanoparticles 40 are made into ink using the solvent 42 to obtain ink 44 (step S20). The ink 44 normally has a high viscosity at normal temperature and normal pressure and is essentially a solid. In order to adjust the viscosity of the ink 44, a solvent with a higher vapor pressure than the solvent 42 or a solvent with a lower boiling point than the solvent 42 may be appropriately added to the ink 44.

Next, the ink 44 is slightly heated and fluidized (step S22). For example, in a case where the nanoparticles 40 are made of nickel oxide and the solvent 42 includes ethylene carbonate, the ink 44 obtains a drippable or printable fluidity at around 40° C.

As illustrated in FIGS. 6 and 7, the ink 44 is then dropped or printed onto the anode 10 (and/or onto the bank 12) (step S24). FIG. 7 illustrates an ink cross-section of the ink 44 after dropping or printing.

As illustrated in FIG. 6, next, the ink 44 is further heated together with the substrate 4 to increase the fluidity of the ink 44 (step S26). For example, in a case where the nanoparticles 40 are made of nickel oxide and the solvent 42 includes ethylene carbonate, the ink 44 is heated to around 130° C. Due to the increase in fluidity, the ink 44 wet-spreads on the anode 10 (and/or on the bank 12) and becomes substantially flat. Here, in a case where, in addition to the solvent 42, another solvent different from the solvent 42 is also added to the ink 44 and the vapor pressure of the other solvent is higher than that of the solvent 42 or the boiling point of the other solvent is lower than that of the solvent 42, the other solvent easily volatilizes from the ink 44 and is reduced or removed. On the other hand, the solvent 42 is relatively difficult to volatilize from the ink 44, and is not significantly reduced or remains.

Then, the ink 44 is spun together with the substrate 4 using a spin coater while the ink 44 is hot (step S28). The ink 44 further wet-spreads on the anode 10 (and/or on the bank 12) via the centrifugal force caused by the spin.

Next, the ink 44 is naturally cooled or forcibly cooled together with the substrate 4 (step S30). Due to the cooling, the fluidity of the ink 44 decreases and the ink 44 is substantially solidified. The solidified ink 44 is the hole injection layer 20.

In a case where the hole injection layer 20 is patterned using a printing technique such as an ink-jet method or a screen printing method, step S28 is omitted. In a case where the hole injection layer 20 is formed in an island shape for each light-emitting element by patterning, the hole injection layer 20 and the hole transport layer 22 may have a uniform film thickness.

Action and Effects

As described above, the hole injection layer 20 is formed by applying the ink 44. Thus, the hole injection layer 20 according to the present embodiment can be more easily formed with a substantially uniform thickness over a large area as compared with a known technique in which a metal compound with hole transport properties is vapor-deposited. Furthermore, the hole injection layer 20 according to the present embodiment requires less cost and a fewer number of steps for formation.

In addition, with a known technique in which a metal compound with hole transport properties is dispersed in a solvent having a high vapor pressure such as water or an alcohol, the solvent easily volatilizes, and thus the viscosity and the concentration of the ink easily change with time. Thus, mass production and long-term storage of the ink have been difficult. Furthermore, the solvent remaining in the hole injection layer diffuses into other layers such as the light-emitting layer and changes the properties of the other layers. On the other hand, according to the present embodiment, since the vapor pressure of the solvent 42 is low, the ink 44 is suitable for mass production and long-term storage, and the solvent 42 in the hole injection layer 20 is unlikely to diffuse.

In addition, with a known technique in which a metal compound having hole transport properties is dispersed in a solvent having a low polarity such as toluene and octane via an organic ligand, the organic ligand is deteriorated or separated from the quantum dot due to an electrochemical reaction, and thus the hole injection efficiency of the hole injection layer decreases with time. Also, the organic ligands themselves are not suitable for hole injection and hole transport. On the other hand, according to the present embodiment, when the hole injection layer 20 does not include a ligand, the problem caused by the ligand does not occur. Note that in a case where the ligand is not included, the nanoparticles of the metal compound are not dispersed in the low-polarity solvent, and thus it is difficult or impossible to make the metal compound into an ink and to apply the ink using the low-polarity solvent.

Thus, compared with a known technique, the configuration and the method according to the present embodiment have an advantage in that the light-emission characteristics and the reliability of the light-emitting element and the display device 2 are high, and another advantage is that the productivity is high.

Furthermore, according to the present embodiment, since the solvent 42 has high polarity and functions as an electrolyte, the solvent 42 enhances the hole transport properties of the hole injection layer 20. In addition, since the electrons overflowing the light-emitting layer 24 flow through the solvent 42, the electrons are unlikely to be accumulated at the interface with the hole injection layer 20 and in the hole injection layer 20, and deterioration due to the electrochemical reaction of the solvent 42 is unlikely to occur. Thus, there is little or no change in characteristics of the light-emitting element due to the electrochemical reaction.

Modified Example

Note that the scope of the disclosure is not limited by the foregoing. A configuration in which any function layer, for example, any one or more layers of the hole transport layer 22, the electron transport layer 26, the electron injection layer, and the like includes nanoparticles of a metal compound having charge transport properties and a solvent having high polarity and low vapor pressure is included in the scope of the disclosure. In addition, for example, configurations in which various modifications are applied to the arrangement or patterning of any function layer and/or the light-emitting layer 24 are also included in the scope of the disclosure.

Figure 18:
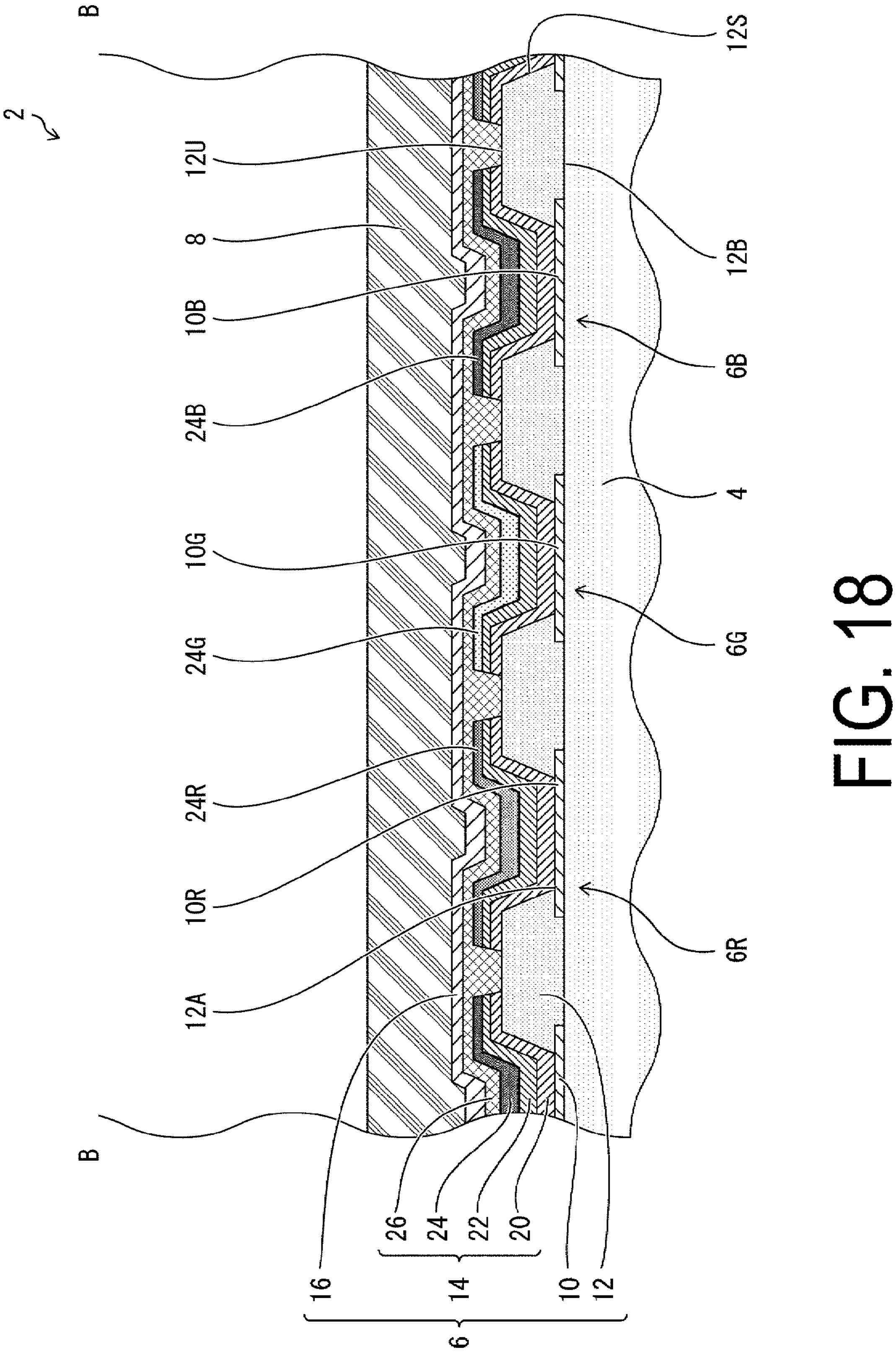
FIG. 18 is a cross-sectional view illustrating a modified example of a schematic configuration of the display region illustrated in FIG. 1.

FIG. 18 is a cross-sectional view illustrating a modified example of a schematic configuration of the display region DA illustrated in FIG. 1.

As illustrated in FIG. 18, one or more of the hole injection layer 20, the hole transport layer 22, and the electron transport layer 26 may be individually formed for each light-emitting element. Accordingly, a configuration in which a function layer such as the hole injection layer 20 covers only a portion of the side face 12S of the bank 12 close to a boundary line BL is also included in the scope of the disclosure. That is, in FIG. 18, the hole injection layer 20 is individually separated for each light-emitting element at the upper face 12U of the bank 12. However, no such limitation is intended, and a function layer such as the hole injection layer 20 may be individually separated for each light-emitting element on the side face 12S of the bank 12.

Figure 19:
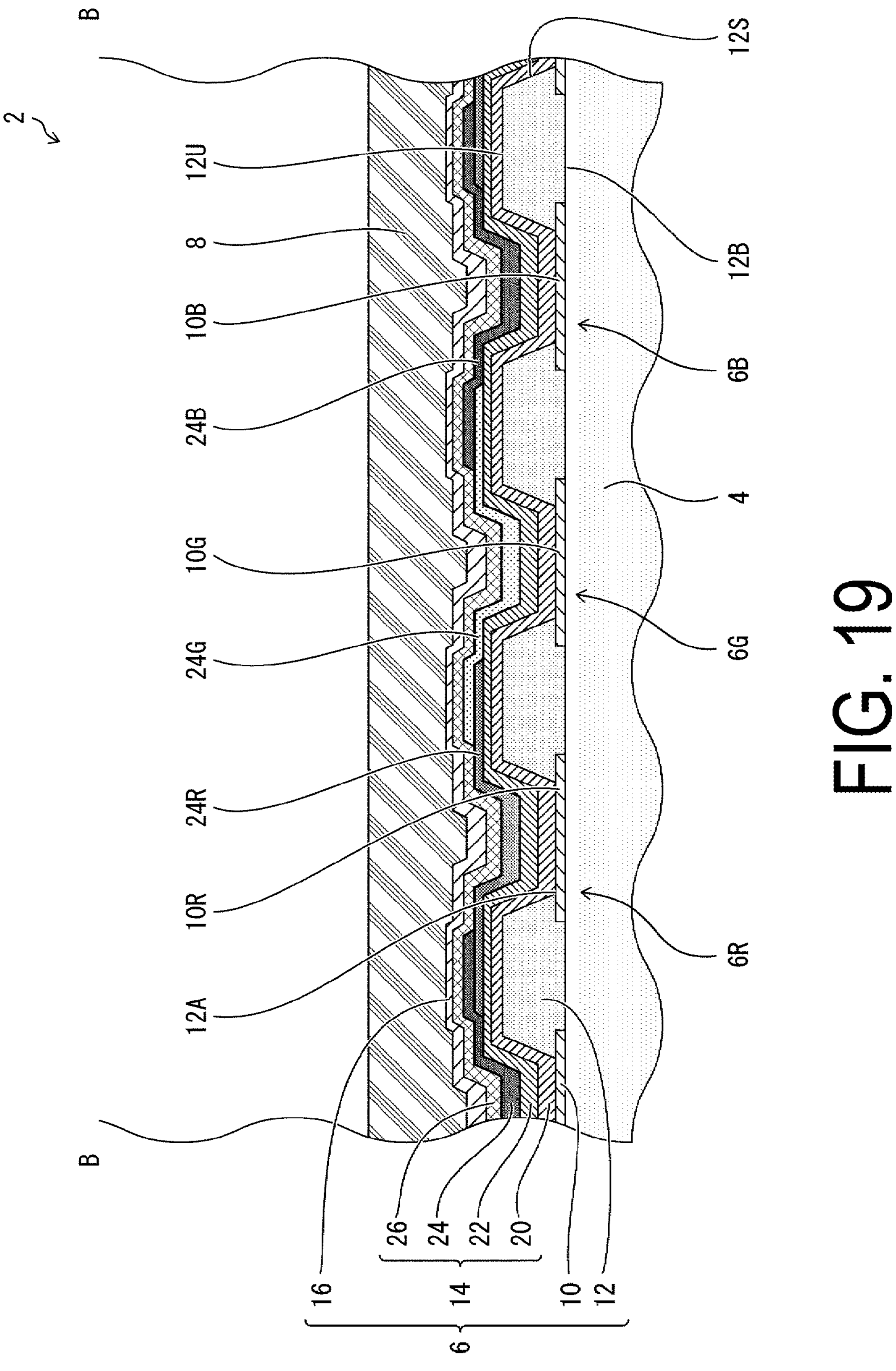
FIG. 19 is a cross-sectional view illustrating another modified example of a schematic configuration of the display region illustrated in FIG. 1.

FIG. 19 is a cross-sectional view illustrating another modified example of a schematic configuration of the display region DA illustrated in FIG. 1.

As illustrated in FIG. 19, the red light-emitting layer 24R, the green light-emitting layer 24G, and the blue light-emitting layer 24B may be formed overlapping one another. Accordingly, configurations in which the electron transport layer 26 is not in direct contact with hole transport layer 22 are also within the scope of the disclosure.

Furthermore, in FIG. 19, a certain light-emitting layer is formed overlapping other light-emitting layers at the upper face 12U of the bank 12. However, no such limitation is intended, and a certain light-emitting layer may be formed overlapping another light-emitting layer at the side face 12S of the bank 12.

Furthermore, a light-emitting layer may be formed only at the upper face 12U of the bank 12 and may be formed overlapping another light-emitting layer.

In the above description, the description of the hole injection layer can be interpreted as long as there is no contradiction by replacing the term "hole injection layer" with "hole transport layer". In a similar manner, when interpreting the description of the electron transport layer or the electron injection layer, it can be interpreted as long as there is no contradiction by replacing the term "hole injection layer" with the term "electron transport layer" or "electron injection layer" and reversing the positive and negative of the charge.

Reference Example 1

A light-emitting element according to Reference Example 1 was formed. In Reference Example 1, the nanoparticles 40 were made of PEDOT, the solvent 42 included water, and the hole transport layer 22 was made of TFB.

Reference Example 2

A light-emitting element according to Reference Example 2 was formed. The light-emitting element according to Reference Example 2 had the same configuration as the light-emitting element according to Reference Example 1 except that the nanoparticles 40 were made of CuSCN.

Reference Example 3

A light-emitting element according to Reference Example 3 was formed. The light-emitting element according to Reference Example 3 had the same configuration as the light-emitting element according to Reference Example 1 except that the nanoparticles 40 were made of nickel oxide.

Reference Example 4

A light-emitting element according to Reference Example 4 was formed. The light-emitting element according to Reference Example 4 had the same configuration as the light-emitting element according to Reference Example 1 except that the nanoparticles 40 were made of PEDOT:PSS.

Prediction Example 1

Prediction Example 1 is an example based on predicting a case of forming a light-emitting element in which the nanoparticles 40 are made of nickel oxide, the solvent 42 includes ethylene carbonate, and the hole transport layer 22 is made of TFB.

Figure 8:
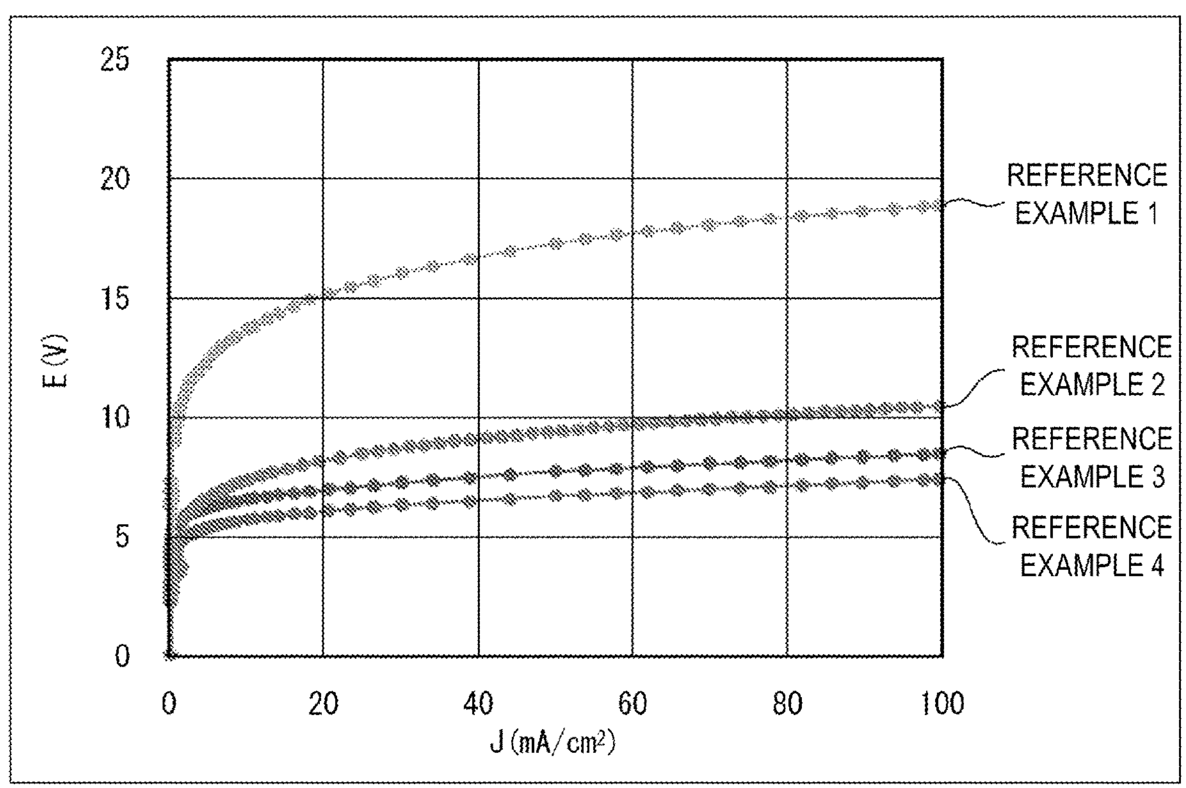
FIG. 8 is a graph showing the relationship between the drive voltage and the current density for light-emitting elements according to the embodiment and reference examples of the disclosure.

FIG. 8 is a graph showing the relationship between a drive voltage E (V) and a current density J (mA/cm$^2$) for the light-emitting elements according to Reference Examples 1 to 4.

Figure 9:
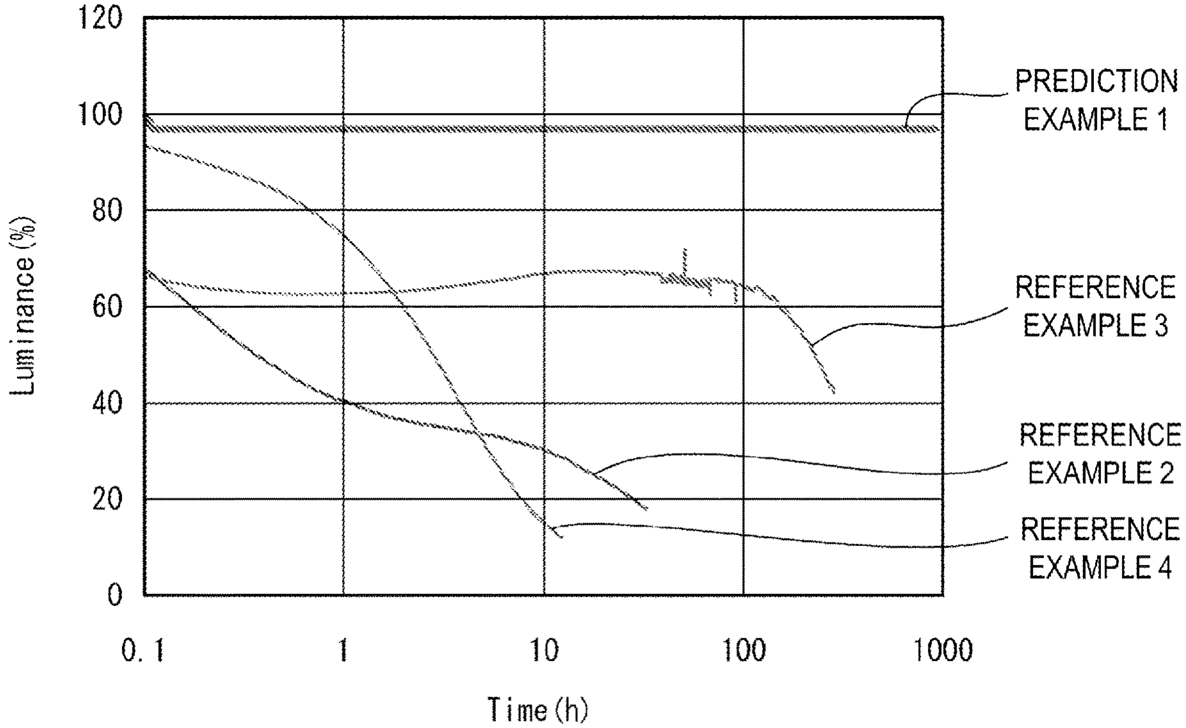
FIG. 9 is a graph showing the relationship between the relative luminance and time for the light-emitting elements according to the embodiment and reference examples of the disclosure.

FIG. 9 is a graph showing the relationship between relative luminance (%) and time (h) for the light-emitting elements according to Reference Examples 2 to 4 and the Prediction Example 1. For the relative luminance, the expected maximum light emission luminance of the light-emitting element according to Prediction Example 1 is taken as 100%.

In FIG. 8, the drive voltage E (V) of the light-emitting elements according to Reference Examples 2 to 4 were significantly lower than the drive voltage E (V) of the light-emitting element according to Reference Example 1. The light emission of the light-emitting element depends on the effective current flowing through the light-emitting layer 24. Thus, the light-emission characteristics of the light-emitting elements according to Reference Examples 2 to 4 were significantly improved from the light-emission characteristics of the light-emitting element according to Reference Example 1. That is, by forming the nanoparticles 40 of the hole injection layer 20 from an inorganic material, the voltage can be lowered.

In addition, the drive voltage E (V) of the light-emitting element according to Reference Example 3 was slightly lower than the drive voltage E (V) of the light-emitting element according to Reference Example 2. Thus, the light-emission characteristics of the light-emitting element according to Reference Example 3 was slightly improved from the light-emission characteristics of the light-emitting element according to Reference Example 2. That is, by forming the nanoparticles 40 of the hole injection layer 20 from nickel oxide, the voltage can be further lowered.

In FIG. 9, the relative luminance (%) of the light-emitting element according to Reference Example 4 rapidly decreases over time (h), and becomes lower than 20% when approximately 10 hours have elapsed. Accordingly, the service life, that is, the long-term reliability of the light-emitting element according to Reference Example 4 is low. Since both the hole injection layer 20 and the hole transport layer 22 according to Reference Example 4 are made of an organic material, it is presumed that the decrease in relative luminance according to Reference Example 4 is caused by deterioration of the hole injection layer 20 and/or the hole transport layer 22 due to electrons overflowing the light-emitting layer 24.

In FIG. 9, on the other hand, the service life of the light-emitting elements according to Reference Examples 2 and 3 are longer than the service life of the light-emitting element according to Reference Example 4, and the service life of the light-emitting element according to Reference Example 3 is longer than the service life of the light-emitting element according to Reference Example 2. Thus, the reliability can be improved by forming the nanoparticles 40 of the hole injection layer 20 from an inorganic material, and the reliability can be further improved by forming the nanoparticles 40 from nickel oxide. The relative luminance (%) of the light-emitting elements according to Reference Examples 2 and 3 decreases with time (h). The hole injection layer 20 according to Reference Examples 2 and 3 includes the nanoparticles 40 made of an inorganic matter such as CuSCN or nickel oxide and the solvent 42 including water. Thus, it is presumed that a main cause of the decrease in relative luminance according to Reference Examples 2 and 3 is deterioration of the light-emitting layer 24 and/or the hole transport layer 22 due to water diffused from the hole injection layer 20.

Accordingly, it is shown that the light-emitting element according to the present embodiment in which the nanoparticles 40 are made of an inorganic matter is excellent in both light-emission characteristics and reliability, and that it is particularly preferable that the nanoparticles 40 are made of nickel oxide.

Note that the scope of the disclosure is not limited by the foregoing. A configuration in which any function layer, for example, any one or more layers of the hole transport layer 22, the electron transport layer 26, the electron injection layer, and the like includes nanoparticles of a metal compound having charge transport properties and a solvent having high polarity and low vapor pressure is included in the scope of the disclosure. In addition, for example, configurations in which various modifications are applied to the arrangement or patterning of any function layer and/or the light-emitting layer 24 are also included in the scope of the disclosure.

In the above description, the description of the hole injection layer can be interpreted as long as there is no contradiction by replacing the term "hole injection layer" with "hole transport layer". In a similar manner, when interpreting the description of the electron transport layer or the electron injection layer, it can be interpreted as long as there is no contradiction by replacing the term "hole injection layer" with the term "electron transport layer" or "electron injection layer" and reversing the positive and negative of the charge.

Second Embodiment

Another embodiment of the disclosure will be described below. Note that, for convenience of description, members having the same functions as those of the members described in the above-described embodiment will be denoted by the same reference numerals and signs, and the description thereof will not be repeated.

The light-emitting element layer 6 according to the present embodiment has a characteristic configuration relating to the hole injection layer 20 and the hole transport layer 22 but otherwise has the same configuration as the light-emitting element layer 6 according to the first embodiment described above.

Figure 10:
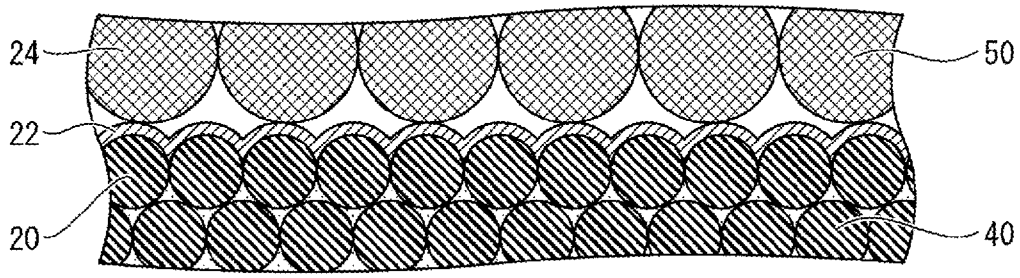
FIG. 10 is a schematic view illustrating a schematic configuration of the hole injection layer, the hole transport layer, and a light-emitting layer in a light-emitting element layer according to another embodiment of the disclosure.

FIG. 10 is a schematic view illustrating a schematic configuration of the hole injection layer 20, the hole transport layer 22, and the light-emitting layer 24 in the light-emitting element layer 6 according to the present embodiment.

Figure 11:
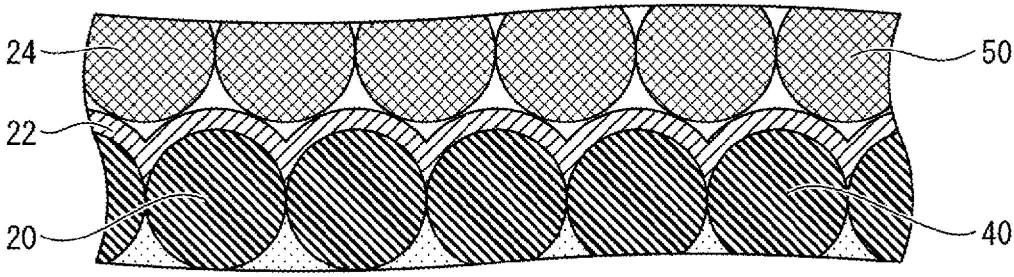
FIG. 11 is a schematic view illustrating a schematic configuration of the hole injection layer, the hole transport layer, and the light-emitting layer in the light-emitting element layer according to a comparative example.

FIG. 11 is a schematic view illustrating a schematic configuration of the hole injection layer 20, the hole transport layer 22, and the light-emitting layer 24 in the light-emitting element layer 6 according to a comparative example.

As illustrated in FIG. 10, in the light-emitting element layer 6 according to the present embodiment, the hole injection layer 20 includes the nanoparticles 40 made of hole transport material, the hole transport layer 22 is formed on the surface of the hole injection layer 20, and the light-emitting layer 24 includes quantum dots 50 as the luminescent bodies. Here, the hole transport layer 22 may be formed to follow the surface of the hole injection layer 20. The average particle diameter of the nanoparticles 40 is smaller than the average particle diameter of the quantum dots 50. Specifically, the average particle diameter of the nanoparticles 40 is in a range from at least 40% to less than 100% of the average particle diameter of the quantum dots 50 and preferably in a range from 60% to 90%.

It is sufficient that the nanoparticles 40 used in the hole injection layer 20 according to the present embodiment have hole transport properties, and the nanoparticles 40 may or may not be dispersible in a high polarity solvent.

The lower face of the hole injection layer 20 is in contact with the anode 10, and the upper face of the hole transport layer 22 is in contact with the light-emitting layer 24. The thickness of the hole injection layer 20 is from 1 nm to 50 nm, and the thickness of the hole transport layer 22 is from 1 nm to 50 nm.

The charge transport mechanism in the light-emitting element layer 6 includes a transport mechanism by a light emitting diode, a transport mechanism by a shunt resistor, and a transport mechanism by a space charge limited current.

Among these, the current transported by the light emitting diode (hereinafter referred to as the "diode current") is an effective current directly related to the recombination of positive holes and electrons and light emission in the quantum dots 50. The diode current can be described by the Shockley equation as the current flowing through a semiconductor junction.

The current transported by the shunt resistor (hereinafter referred to as the "shunt current") is the current flowing through the insulation resistor in parallel with the light emitting diode. Thus, the shunt current is an invalid current that does not contribute to light emission and is a linear component proportional to voltage. The shunt current is usually negligible because it is very small and does not substantially affect the light-emission characteristics.

The space charge limited current is a current flowing through a medium other than the quantum dots 50 and the shunt resistor (not illustrated) and having a charge mobility that is small but of a magnitude that cannot be ignored. Specifically, the space charge limited current flows through, for example, a ligand (not illustrated) included in the light-emitting layer 24 and/or an organic matter (not illustrated) such as the hole transport material included in the hole transport layer 22. Thus, the space charge limited current is an invalid current that does not contribute to light emission. The space charge limited current depends on the distance and voltage between the hole injection layer 20 and the light-emitting layer 24 and on the charge mobility and dielectric constant of the medium, as shown by the equation below. In particular, the space charge limited current is proportional to distance to the power of −3.

$$I = \frac{9}{8} * \frac{\varepsilon \mu V^2}{d^3} \quad \text{[Expression 1]}$$

Where I represents the magnitude of the space charge limited current, d and V represent the distance and voltage between the hole injection layer 20 and the light-emitting layer 24, and ε and μ represent the dielectric constant and charge mobility of the medium.

In the disclosure, the distance between the hole injection layer 20 and the light-emitting layer 24 means the average distance in the vertical direction from the surface of the nanoparticles 40 included in the hole injection layer 20 to the surface of the quantum dots 50 included in the light-emitting layer 24. In a case where the hole injection layer 20 includes a plurality of particle layers, the distance between the hole injection layer 20 and the light-emitting layer 24 means the average distance in the vertical direction from the surface of the nanoparticles 40 included in the particle layer closest to the light-emitting layer 24. In a case where the light-emitting layer 24 includes a plurality of particle layers, the distance between the hole injection layer 20 and the light-emitting layer 24 means the average distance in the vertical direction to the surface of the quantum dots 50 included in the particle layer closest to the hole injection layer 20.

The configuration of the comparative example illustrated in FIG. 11 is the same as the configuration according to the present embodiment shown in FIG. 10 except that the average particle diameter of the nanoparticles 40 is close to the average particle diameter of the quantum dots 50.

In the comparative example illustrated in FIG. 11, the average particle diameter of the nanoparticles 40 is close to the average particle diameter of the quantum dots 50, and the particle diameter distribution of the nanoparticles 40 is small. Thus, on the upper face of the hole injection layer 20 having a thickness suitable for hole injection, periodic unevenness is formed at a period close to the average particle diameter of the quantum dots 50, and the depth of the unevenness is approximately half the particle diameter of the quantum dots 50. Since the hole transport layer 22 follows the surface of the hole injection layer 20, similar unevenness occurs also on the surface of the hole transport layer 22. Since the quantum dots 50 are easily aligned conforming to the unevenness of the hole transport layer 22, the average distance from the surface of the nanoparticles 40 to the surface of the quantum dots 50 is small.

On the other hand, according to the configuration of the disclosure illustrated in FIG. 10, the average particle diameter of the nanoparticles 40 is smaller than the average particle diameter of the quantum dots 50. Thus, the unevenness formed on the upper face of the hole injection layer 20 and the hole transport layer 22 according to the disclosure makes it difficult for the quantum dots 50 to align. As a result, the average distance from the surface of the nanoparticles 40 to the surface of the quantum dots 50 according to the disclosure is larger than that in the comparative example.

As described above, the space charge limited current is proportional to the distance between the hole injection layer 20 and the light-emitting layer 24 to the power of −3. Thus, according to the configuration of the disclosure, since the space charge limited current is small, the invalid current is small and the EQE is high.

Furthermore, in a case where the variation in the particle diameter of the nanoparticles 40 on the outermost surface of the hole injection layer 20 located below as seen from the light-emitting layer 24 is large, the number of the quantum dots 50 filling the gaps between the nanoparticles 40 increases, and thus the average distance between the hole injection layer 20 and the light-emitting layer 24 is small. On the other hand, in a case where the variation in particle diameter of the nanoparticles 40 is small, the average distance between the hole injection layer 20 and the light-emitting layer 24 is large. That is, as the distribution range of the particle diameter of the nanoparticles 40 is narrower and the number of the nanoparticles 40 having a particle diameter larger than the average particle diameter is smaller, the average distance between the hole injection layer 20 and the light-emitting layer 24 is larger. Thus, the particle diameter of the nanoparticles 40 is in a range from at least −4 nm to +50 nm with respect to the average particle diameter of the nanoparticles 40 and preferably in a range from −4 nm to +30 nm. It is preferable that Qσ/Qa>Pσ/Pa be satisfied, where Pa is the average particle diameter of the nanoparticles 40, Pσ is the standard deviation of the particle diameters of the nanoparticles 40, Qa is the average particle diameter of the quantum dots 50, and Qσ is the standard deviation of the quantum dots 50. Furthermore, in the particle diameter distribution of the nanoparticles 40, the modal value is preferably on the smaller diameter side than the median value and/or the average value.

Average Particle Diameter and Particle Diameter Distribution

The average particle diameter and particle diameter distribution of the nanoparticles 40 in the disclosure may be nominal or designed values or measured values.

The measurement can be calculated on the basis of a method such as light scattering of a solution including the nanoparticles 40, X-ray scattering of a layer including the nanoparticles 40, or observation of a cross-section of a layer including the nanoparticles 40 with a scanning or transmission electron microscope. Specifically, a dynamic light scattering method may be used in which laser light is made incident on a solution and the scattered light is detected. This measurement is suited to being performed before the formation of the hole injection layer 20. Alternatively, small-angle X-ray scattering may be used in which X-rays are made incident on the surface of a film-formed sample at a very small angle and the scattering thereof is detected. This method is suited to being performed after the formation of the hole injection layer 20.

The measurement can be performed on the basis of, for example, a cross-sectional image of the hole injection layer 20. Specifically, the hole injection layer 20 is cut, and the cross section is photographed using a scanning electron microscope (SEM). Then, at any position in the cross-sectional photograph, the particle diameter of the nanoparticles 40 observed with a width in a range from 200 μm to 1000 μm is measured.

The average particle diameter is obtained by calculating the average value of the measured particle diameters, and the range of the particle diameter distribution is the range from the minimum value to the maximum value of the measured particle diameters. Here, the number of nanoparticles 40 measured for the particle diameter may be smaller than the number required to sufficiently reduce the statistical significance. This is because in a general method for producing nanoparticles including the nanoparticles of the present application, raw materials are reacted under chemically and thermodynamically balanced conditions, and thus a very small particle diameter distribution can be naturally achieved at the production stage. For example, if about 500 measurements are required to obtain a significance of 5%, only about 100 measurements may be taken.

In a case where the shape of the nanoparticles 40 is not spherical, the diameter of a circle having an area equal to the area of the cross section of the nanoparticle is defined as the particle diameter of the nanoparticle 40.

In a similar manner, the average particle diameter of the quantum dots 50 may be a nominal value or a designed value or may be a measured value.

Example 1

A light-emitting element according to Example 1 of the present embodiment was formed. In Example 1, the nanoparticles 40 were made of nickel oxide, the average particle diameter of the nanoparticles 40 was approximately 9 nm, the minimum particle diameter of the nanoparticles 40 was approximately 6 nm, and the maximum particle diameter was approximately 55 nm. That is, the particle diameter of the nanoparticles 40 was in a range from −4 nm to +50 nm with respect to the average particle diameter. The average particle diameter of the quantum dots 50 was approximately 10 nm, the minimum particle diameter of the quantum dots 50 was approximately 9 nm, and the maximum particle diameter of the quantum dots 50 was approximately 12 nm.

Figure 12:
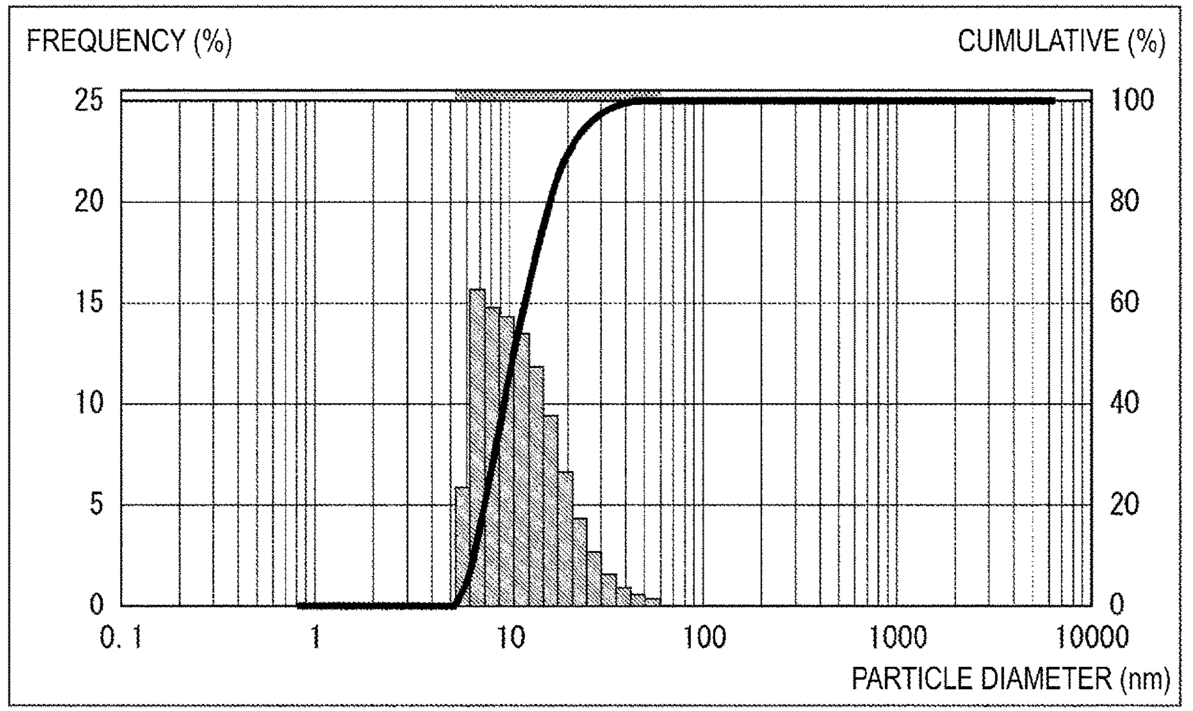
FIG. 12 is a graph showing the particle diameter distribution of nanoparticles according to an example of the embodiment of the disclosure.

FIG. 12 is a graph showing the particle diameter distribution of the nanoparticles 40 in Example 1. In FIG. 12, the frequency distribution of the particle diameters is shown by a bar graph referring to the left scale, the cumulative distribution of the particle diameters is shown by a line graph referring to the right scale, and the distribution range of the particle diameters is shown by shading in the upper portion.

Reference Example 5

A light-emitting element according to Reference Example 5 was formed. The light-emitting element according to Reference Example 5 had the same configuration as the light-emitting element according to Example 1 except that the average particle diameter of the nanoparticles 40 was approximately 16 nm, the minimum particle diameter of the nanoparticles 40 was approximately 12 nm, and the maximum particle diameter was approximately 68 nm.

Thus, in the light-emitting element according to Reference Example 5, the particle diameter of the nanoparticles 40 is close to the particle diameter of the quantum dots 50.

Detailed Analysis of Light-Emitting Element

Figure 13:
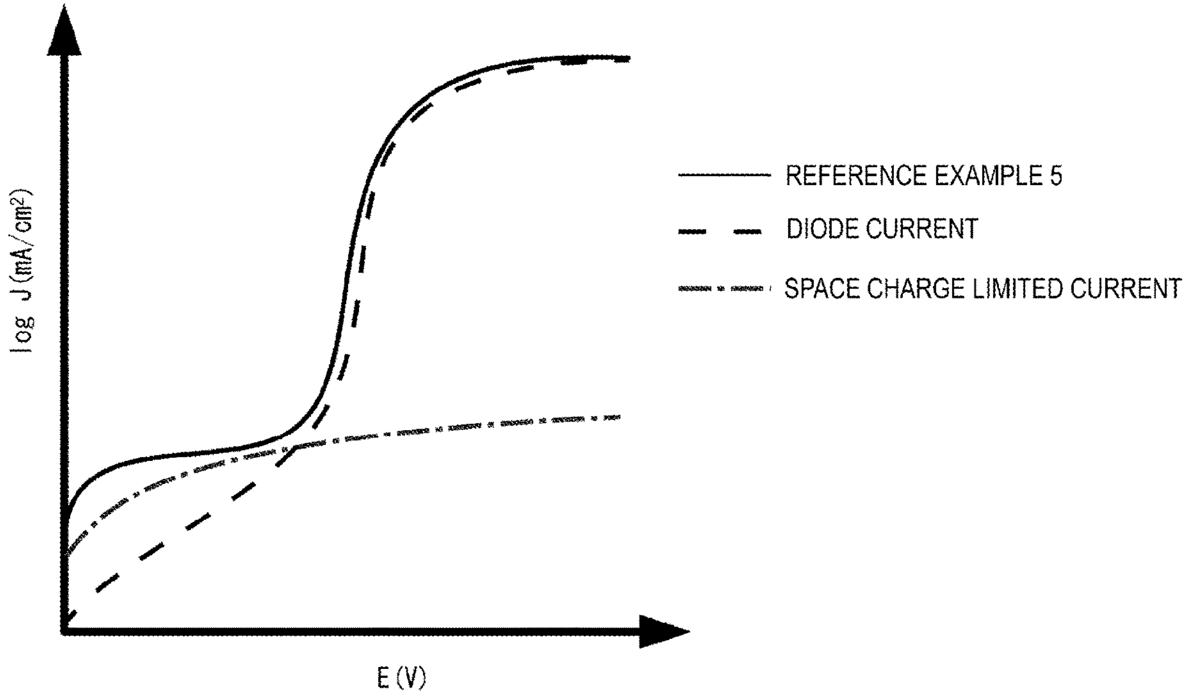
FIG. 13 is a semi-log graph showing the relationship between the drive voltage and the current density in the light-emitting element layer of a reference example and the analysis results thereof.

FIG. 13 is a semi-log graph showing the relationship between the drive voltage E (V) and the current density J ($mA/cm^2$) in the light-emitting element layer 6 of Reference Example 5 and the analysis results thereof.

Figure 14:
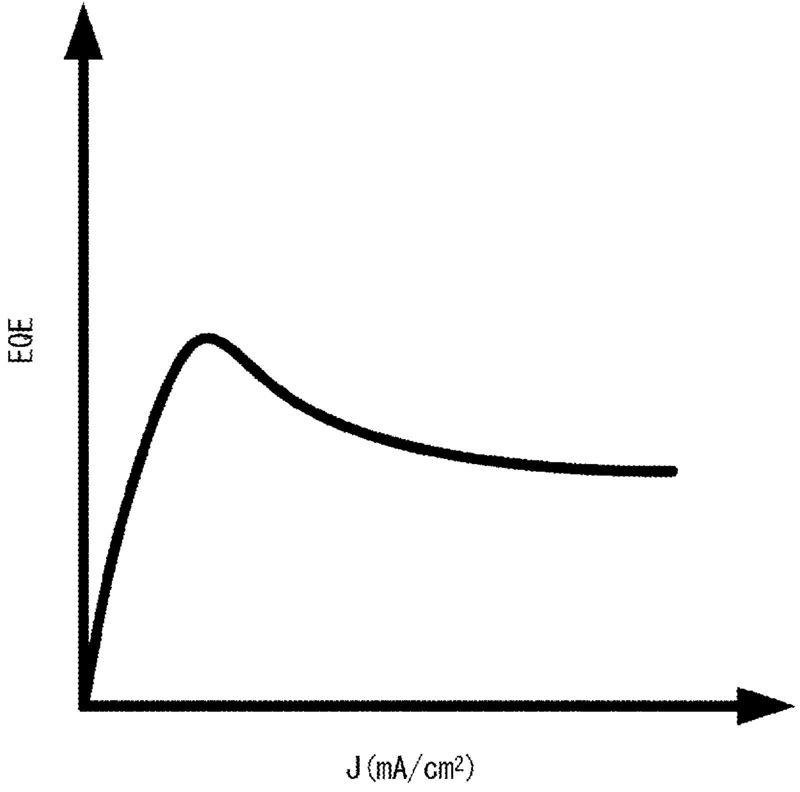
FIG. 14 is a graph showing the relationship between the EQE and the current density J ($mA/cm^2$) in the light-emitting element layer of a reference example.

FIG. 14 is a graph showing the relationship between the EQE and the current density J ($mA/cm^2$) in the light-emitting element layer 6 of Reference Example 5.

The inventors of the disclosure analyzed the current-voltage characteristics of the light-emitting element layer 6 of Example 1 and Reference Example 5. As described above, the shunt component is negligibly small. Thus, in the detailed analysis, the current analysis was performed by combining the diode equation and the equation of the space charge limited current as a parallel circuit.

As shown in FIG. 13, the space charge limited current of the light-emitting element layer 6 of Reference Example 5 was large to a level close to that of the diode current. This is because the thickness of each layer in the light-emitting element layer 6 is thin to the order of nanometers, and thus d is small.

As shown in FIG. 14, accordingly, the space charge limited current of the light-emitting element layer 6 of Reference Example 5 affects the EQE of the light-emitting element layer 6 of Reference Example 5.

On the other hand, for the current-voltage characteristics of the light-emitting element layer 6 according to Example 1, the space charge limited current was smaller than that for the current-voltage characteristics of Reference Example 5. The EQE of the light-emitting element layer 6 according to Example 1 was better than the EQE of Reference Example 5. Thus, it can be determined that by increasing the distance d between the hole injection layer 20 and the light-emitting layer 24, the space charge limited current is decreased and the EQE is improved.

As shown in FIG. 12, for the particle diameter of the nanoparticles 40 in Example 1, the modal value was in a range from 6 nm to 7 nm, and the median value was in a range from 10 nm to 20 nm. As described above, for the particle diameter of the nanoparticles 40 in Example 1, average value was approximately 9 nm, the minimum value was approximately 6 nm, and the maximum value was approximately 55 nm. Thus, while the width between the average value and the maximum value is greater than the width between the average value and the minimum value, there are more of the nanoparticles 40 that are smaller than the average than the nanoparticles 40 that are larger than the average.

More specifically, the particle diameter distribution of the nanoparticles 40 of Example 1 satisfied $3*P\sigma < (Pmax-Pmin)$, where Pmax is the maximum particle diameter of the nanoparticles 40, Pmin is the minimum particle diameter of the nanoparticles 40, and Pσ is the standard deviation of the particle diameters of the nanoparticles 40. In the disclosure, "*" is used as an operation symbol indicating integration.

In the case of a regular distribution, three times the standard deviation is approximately equal to the difference between the maximum value and the minimum value. That is, $3*\sigma \approx (Max-Min)$ is satisfied, where Max is the maximum value in the regular distribution, Min is the minimum value, and o is the standard deviation.

Thus, the standard deviation of the nanoparticles 40 in Example 1 is smaller than the standard deviation in the regular distribution. In other words, as shown in FIG. 12, the particle diameter distribution of the nanoparticles 40 in Example 1 has a long tail on the large diameter side and thus is distributed more widely on the larger diameter than average side, but the amount of data on the larger diameter than average side is small, and thus the variation itself is not large.

Note that the configuration according to the present embodiment can be combined with the configuration according to the first embodiment described above. For example, the hole injection layer 20 may include the nanoparticles 40 smaller than the quantum dots 50 and the solvent 42 having a high polarity and a low vapor pressure, the nanoparticles 40 may be dispersed in the solvent 42, and the ratio of the nanoparticles 40 may be high such that unevenness is formed on the upper face of the hole injection layer 20 by the nanoparticles 40.

Note that after the formation of a function layer such as the hole injection layer 20 including the nanoparticles 40 of the disclosure, the nanoparticles 40 may be exposed on the surface of the function layer, and the hole transport layer 22 may be formed following the surface of the nanoparticles 40 exposed from the surface of the function layer. In this case, since the distance between the hole injection layer 20 and the light-emitting layer 24 can be increased, the effect of reducing the invalid current can be obtained.

The scope of the disclosure is not limited by the foregoing. A configuration in which any function layer, for example, any one or more layers of the hole transport layer 22, the electron transport layer 26, the electron injection layer, and the like includes nanoparticles of a metal compound having charge transport properties and a solvent having high polarity and low vapor pressure is included in the scope of the disclosure. In addition, for example, configurations in which various modifications are applied to the arrangement or patterning of any function layer and/or the light-emitting layer 24 are also included in the scope of the disclosure.

In the above description, the description of the hole injection layer can be interpreted as long as there is no contradiction by replacing the term "hole injection layer" with "hole transport layer". In a similar manner, when interpreting the description of the electron transport layer or the electron injection layer, it can be interpreted as long as there is no contradiction by replacing the term "hole injection layer" with the term "electron transport layer" or "electron injection layer" and reversing the positive and negative of the charge.

Third Embodiment

Figure 15:
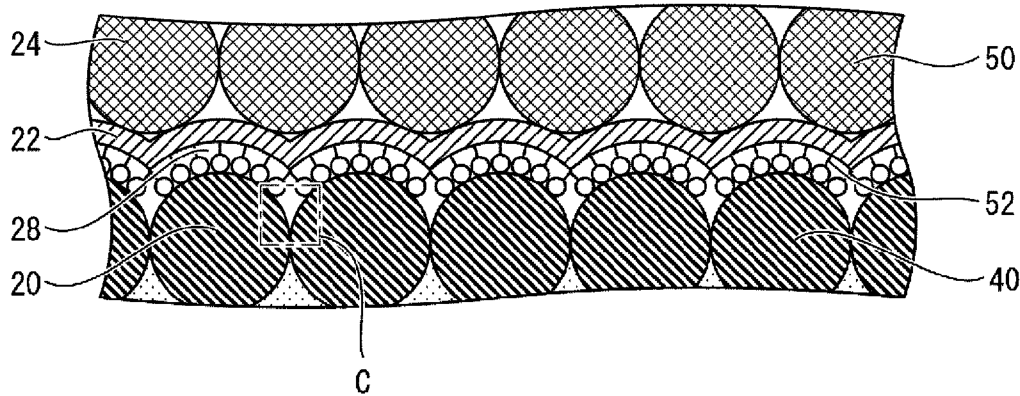
FIG. 15 is a schematic view illustrating a schematic configuration of the hole injection layer, the hole transport layer, the light-emitting layer, and a monolayer film in the light-emitting element layer according to the present embodiment of the embodiment of the disclosure.

FIG. 15 is a schematic view illustrating a schematic configuration of the hole injection layer 20, the hole transport layer 22, the light-emitting layer 24, and a monolayer film 28 in the light-emitting element layer 6 according to the present embodiment.

As illustrated in FIG. 15, the light-emitting element layer 6 according to the present embodiment has the same configuration as the light-emitting element layer 6 according to the first and second embodiment described above except that the monolayer film 28 is provided between the hole injection layer 20 and the hole transport layer 22.

Note that it is sufficient that the nanoparticles 40 used in the hole injection layer 20 according to the present embodiment have hole transport properties, and the nanoparticles 40 may or may not be dispersible in a high polarity solvent.

Monolayer Film

The monolayer film 28 is most preferably provided only on the surface of the hole injection layer 20 facing the layer of the quantum dots 50 (in other words, the light-emitting layer 24). In addition, the monolayer film 28 may be provided at other positions, but in such cases, the luminous efficiency may be reduced. For example, in a case where the monolayer film 28 is provided on both the surface of the hole injection layer 20 facing the light-emitting layer 24 and the surface of the hole injection layer 20 facing the anode 10, which is the opposite surface, the parallel resistance of the hole injection layer 20 may be reduced because of the hole transport properties of the monolayer film 28. In order to suppress the ohmic leakage current, a higher parallel resistance is more desirable, and when the parallel resistance decreases, carriers that are not injected into the quantum dots 50 increase and the luminous efficiency decreases.

The monolayer film 28 includes molecules 52. The molecules 52 may include only one type of molecule or may include two or more types of molecules.

The monolayer film 28 and the molecules 52 have hole transport properties. The molecule 52 includes, for example, a molecular chain having hole transport properties and a functional group that is adsorbed to the surface of the nanoparticle 40. The functional group is preferably bonded to one end of a molecular chain or to both ends of a symmetrical molecular chain.

It is preferable that the monolayer film 28 is a self-assembled monolayer (SAM), that is, the molecules 52 have self-assembly capability. This is because, as will be described below, the monolayer film 28 can be formed by a simple method such as applying a solution obtained by dissolving the molecules 52 in a solvent to the hole injection layer 20.

In the monolayer film 28, a plurality of the same molecule 52 are preferably arranged adjacent to one another. This is because the monolayer film 28 can be formed to have a substantially uniform film thickness because the thickness is constituted by the same molecules, the film quality can be substantially uniform because the monolayer film 28 is constituted by the same molecules, and the molecules can be densely distributed in the film because the monolayer film 28 has a structure in which the same molecules are arranged adjacent to one another. Furthermore, it is preferable that the molecules 52 constituting the monolayer film 28 are arranged with equal intervals between adjacent molecules as this allows for a denser distribution. In addition, it is preferable that the molecules 52 constituting the monolayer film 28 are arranged in the same orientation as one another as this allows for a denser distribution and a strong bond can be formed by interaction.

For example, the molecule 52 can include at least one molecule selected from R—SH, RS—SR', R—RSCN, R—SeH, R—TeH, RSe—SeR', R—NC, R—NCO, $R—SiH_3$, $R—Si(CH_3)_2H$, $R—Si(CH_3)_3$, R—COOH, dye-COOH, $R—PO_3H_2$, $RO—PO_3H_2$, $R—SiX_2[X{=}Cl, OCH_3, OC_2H_5]$, $R—NH_2$, R—OH, $[R—C(O)O]_2$, $R—CH{=}CH_2$, R—C≡CH, $R—MgBr_2$, R—Li, $Ar—N_2^+X^-[X{=}Cl, OCH_3, OC_2H_5]$, and $R—BrR—CH{=}CH_2$, where R and R' represent the functional groups included in the molecule 52. These molecules self-assemble to form a monolayer film.

Here, H represents hydrogen, S represents sulfur, C represents carbon, N represents nitrogen, Si represents silicon, Cl represents chlorine, Se represents selenium, Te represents tellurium, Mg represents magnesium, Br represents bromine, Li represents lithium, Ar represents an aryl group, and X represents any one of Cl, $OCH_3$, and $OC_2H_5$.

It is particularly preferable that the molecule 52 includes at least one selected from MeO-2PACz, BA-$CF_3$, 2PACz, and Me-4PACz.

Self-Assembly

Figure 16:
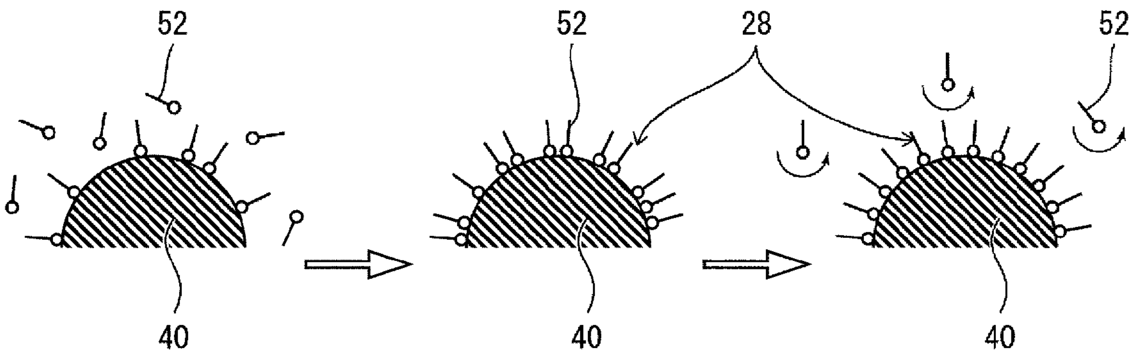
FIG. 16 is a schematic view illustrating the self-assembly of molecules.

FIG. 16 is a schematic view illustrating the self-assembly of the molecules 52.

First, a solution obtained by dissolving the molecules 52 in a solvent is applied to the surface of the hole injection layer 20 by spin coating or dipping.

As illustrated on the left side of FIG. 16, the molecules 52 in the solution are adsorbed onto the surface of the nanoparticles 40 via the functional groups. The molecules 52 repeat adsorption and desorption to form the monolayer film 28 as illustrated in the center of FIG. 16.

The total of the surface energy of the hole injection layer 20 and the surface energy of the molecules 52 is decreased by the adsorption of the molecules 52 to the nanoparticles 40. Thus, as many molecules 52 as possible tend to be adsorbed to the nanoparticles 40. On the other hand, the molecules 52 tend to be separated from one another by a predetermined distance or more due to the interaction between the molecular chains. This predetermined distance is determined by the molecular chain. In addition, since the molecule 52 includes a functional group only at one end of the molecular chain or includes functional groups at both ends of a symmetrical molecular chain, the orientation of the molecular chain is automatically aligned when the molecule 52 bonds with the nanoparticle 40. As a result, the molecules 52 self-assemble and cover the entire surface of the hole injection layer 20 on the side facing the layer of the quantum dots 50 at a substantially uniform density.

Then, as illustrated on the right side of FIG. 16, the excessive molecules 52 are removed by the reduction of the surface energy, and two or more layers of the monolayer film 28 are not formed.

Next, the solvent is removed by heat treatment or the like, and the monolayer film 28 is fixed on the surface of the hole injection layer 20.

In this example, though the monolayer film 28 is formed after the hole injection layer 20 including the nanoparticles 40 is formed, no such limitation is intended, and the monolayer film 28 may be formed on the nanoparticles 40 before the hole injection layer 20 is formed.

However, it is preferable to form the monolayer film 28 after forming the hole injection layer 20 including the nanoparticles 40 because there is no need to take measures to solve the disadvantages otherwise caused. In other words, in a case where the monolayer film 28 is formed on the nanoparticles 40 before the formation of the hole injection layer 20, the hole injection layer 20 is formed by applying a solution including the nanoparticles 40 in a state where the monolayer film 28 is formed on the entire nanoparticles 40. However, the nanoparticles 40 with the formed monolayer film 28 may not disperse well in the solution due to the relationship between the polarity of the monolayer film 28 and the polarity of the solvent. In such a case, formation of the hole injection layer 20 is difficult.

However, even in a case where the monolayer film 28 is formed on the nanoparticles 40 before the formation of the hole injection layer 20, by using a high polarity solvent as the solvent at the time of application when forming the hole injection layer 20, even the nanoparticles 40 with the formed monolayer film 28 are well dispersed in the solution. This makes formation of the hole injection layer 20 easy, which is desirable.

In both the case where the hole injection layer 20 is formed after the formation of the monolayer film 28 on the nanoparticles 40 and the case where the monolayer film 28 is formed on the nanoparticles 40 after the formation of the hole injection layer 20, it is more desirable that the monolayer film 28 on the nanoparticles 40 covers the surface of the hole injection layer 20 after the formation of the hole injection layer 20 and the monolayer film 28 and is exposed as an underlayer of the hole transport layer 22. This is because, although the effect of reducing the invalid current by forming the monolayer film 28 can be obtained even in a case where the monolayer film 28 is not exposed, the effect of reducing the invalid current by forming the monolayer film 28 can be further enhanced by exposing the monolayer film 28. That is, although the distance between the hole injection layer 20 and the light-emitting layer 24 can be increased by forming the monolayer film 28 even when the monolayer film 28 is not exposed, the rate of increase in the distance can be further increased by exposing the monolayer film 28, and the effect of reducing the invalid current can be further enhanced accordingly, which is desirable.

In a case where the monolayer film 28 is formed on the nanoparticles 40 after the formation of the hole injection layer 20, it is more desirable that the nanoparticles 40 are exposed on the surface of the hole injection layer 20 after the formation of the hole injection layer 20 including the nanoparticles 40 of the disclosure and before the formation of the monolayer film 28. That is, as illustrated in FIG. 4, it is more preferable that level F of the uppermost portion of the nanoparticles 40 is higher than level E of the upper face (surface) of the solvent 42 (including the solvent before or after the solidifying process) of the function layer. This is because the monolayer film 28 can be exposed as described above and the effect of reducing the invalid current can be enhanced.

In addition, in a case where the monolayer film 28 is exposed as the underlayer of the hole transport layer 22 as described above and the hole transport layer 22 is formed following the surface of the monolayer film 28, the increase rate of the distance can be further increased. This further enhances the effect of reducing the invalid current.

Example 2

A light-emitting element according to Example 2 of the present embodiment was formed. In Example 2, the thickness of the hole injection layer 20 was 20 nm, the nanoparticles 40 were made of nickel oxide, the molecules 52 constituting the monolayer film 28 were MeO-2PACz, the thickness of the hole transport layer 22 was 40 nm, and the hole transport layer 22 was made of p-TPD.

The monolayer film 28 was formed by dissolving MeO-2PACz in ethanol to make a solution with a concentration of 0.01 mol/l, applying the MeO-2PACz solution on the hole injection layer 20, and drying the MeO-2PACz solution after 5 seconds or more have elapsed. In this manner, a SAM was formed on the surface of the hole injection layer 20.

Example 3

A light-emitting element according to Example 3 of the present embodiment was formed. The light-emitting element according to Example 3 had the same configuration as the light-emitting element according to Example 2 except that the molecules 52 were BA-$CF_2$ and the nanoparticles 40 were made of chromium oxide.

"Chromium oxide" in the disclosure means a compound including chromium and oxygen. That is, chromium oxide includes in its meaning not only single element CrO, single element $Cr_2O_3$, single element $CrO_2$, and single element $CrO_3$ having the same valence, but also a mixture including any two or more of CrO, $Cr_2O_3$, $CrO_2$, and $CrO_3$ having different valences, a mixture including a chromium compound other than an oxide in addition to any one or more of CrO, $Cr_2O_3$, $CrO_2$, and $CrO_3$, or a mixture including a metal compound other than a chromium compound in addition to any one or more of CrO, $Cr_2O_3$, $CrO_2$, and $CrO_3$. "Chromium oxide" in the disclosure means mixtures that are produced and/or used in industry as chromium oxide.

Example 4

A light-emitting element according to Example 4 of the present embodiment was formed. The light-emitting element according to Example 4 had the same configuration as the light-emitting element according to Example 2 except that the molecules 52 were made 2PaCz.

Example 5

A light-emitting element according to Example 5 of the present embodiment was formed. The light-emitting element according to Example 5 had the same configuration as the light-emitting element according to Example 2 except that the molecules 52 included MeO-4PACz and MeO-2PACz and the monolayer film 28 was formed using a mixed solution of MeO-4PACz and MeO-2PACz at a weight ratio of 1:1.

Reference Example 6

A light-emitting element according to Reference Example 6 was formed. The light-emitting element according to Reference Example 6 had the same configuration as the light-emitting element according to Example 2 except that the monolayer film 28 was not provided.

Reference Example 7

A light-emitting element according to Reference Example 7 was formed. The light-emitting element according to Reference Example 7 had the same configuration as the light-emitting element according to Example 2 except that the monolayer film 28 was not provided.

Reference Example 8

A light-emitting element according to Reference Example 8 was formed. The light-emitting element according to Reference Example 8 had the same configuration as the light-emitting element according to Example 3 except that the monolayer film 28 was substituted for an $Al_2O_3$ vapor deposition film with a thickness of 2 nm.

Figure 17:
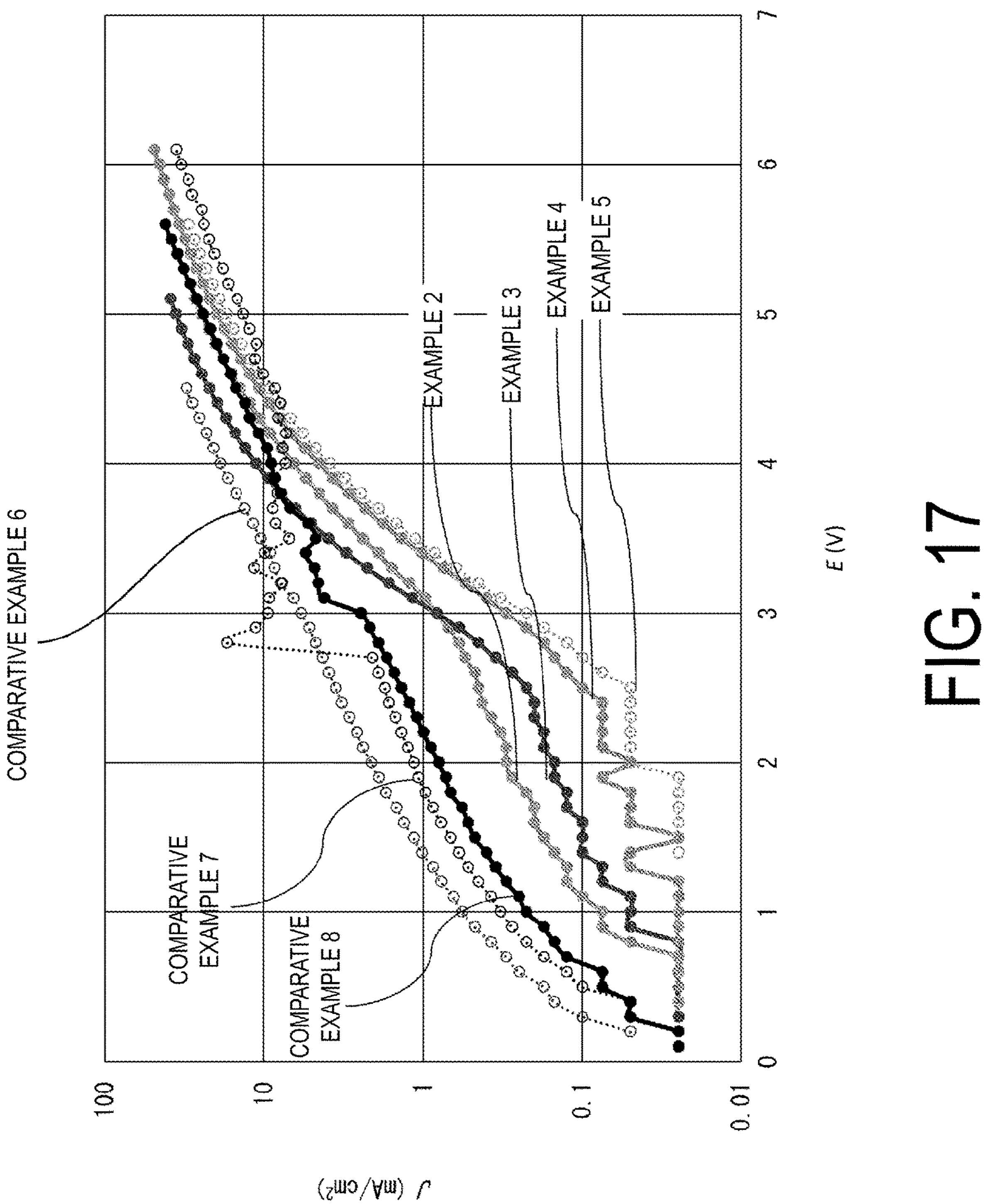
FIG. 17 is a graph showing the relationship between the drive voltage and the current density for light-emitting elements according to examples and reference examples of the embodiment of the disclosure.

FIG. 17 is a graph showing the relationship between a drive voltage E (V) and a current density J ($mA/cm^2$) for the light-emitting elements according to Examples 2 to 5 and Reference Examples 6 to 8.

As shown in FIG. 17, in the light-emitting elements of Reference Examples 6 to 8, in the region of 4V and lower, the current density decreases and the diode characteristics become clear. Any current density drop in this region is an invalid current. On the other hand, in the light-emitting elements of Examples 2 to 5, the current density in the region of 4V and lower is lower than that of the light-emitting elements of Reference Examples 6 to 8.

By introducing an excellent monolayer film 28, the invalid current is reduced to approximately 1/20 in the display device 2.

That is, in a known display device, the ratio of the diode current to the invalid current is approximately 1:1, whereas in the display device 2 according to the present embodiment, by the monolayer film 28 being introduced, the electrical characteristics are improved with the ratio of the diode current to the invalid current being approximately 1:0.05. In addition, the maximum EQE value of the display device 2 according to the present embodiment is enhanced to about twice as high as that of a known display device.

Discussion on Characteristics 1

An overview of the enhancements of the electrical characteristics in the display device 2 of the present embodiment will be described below.

On the outermost surface of the hole injection layer 20, a monolayer film 28 having hole transport properties is uniformly formed as a monolayer layer over the entire surface of the hole injection layer 20 by self-assembly. The hole transport properties of the monolayer film 28 enhances the hole transport to the QDs (1).

In addition, due to the high hole transport properties of the monolayer film 28, the potential difference of the whole monolayer film 28 having the hole transport properties is reduced and the electric field concentration is relaxed (2).

Furthermore, the hole injection layer 20 and the hole transport layer 22 are not in direct contact with one another due to the monolayer film 28 with hole transport properties, and the distance between the nanoparticles 40 and the quantum dots 50 is increased, so that the invalid current is further reduced. Since the space charge limited current is proportional to the distance to the power of −3, even small changes in distance contribute significantly to the current (3).

It is thought that these three effects increase the diode current (1) and decrease the invalid current (2, 3), thereby enhancing the EQE of a QD display device.

Discussion on Characteristics 2

The characteristics including a comparison with a display device having a known configuration will be described in detail below.

In a display device having a known configuration, the hole transport layer 22 made of an organic matter and a light-emitting layer 24 are layered in this order above the hole injection layer 20 including the nanoparticles 40. Thus, an average path from the nanoparticle 40 to the quantum dot 50 through the hole transport layer 22 is short in distance.

Since the VBM, CBM, and Fermi level of the hole injection layer 20 and the hole transport layer 22 are different from one another and the hole transport ability of the hole transport layer 22, which generally uses an organic matter, is insufficient, an invalid current easily flows in the display device 2 having a known configuration.

Furthermore, in a known configuration, an electric field concentration occurs in a geometrically acute region existing at the interface between the hole injection layer 20 and the hole transport layer 22, for example, at a boundary between the nanoparticles 40 adjacent to one another constituting the hole injection layer 20 (a region in the display device with a known configuration corresponding to region C in FIG. 15). Due to this electric field concentration, a larger invalid current flows in this region.

For these reasons, in a display device having a known configuration, the influence of the invalid current is large and the EQE is low.

Thus, studies were conducted to enhance the EQE, and the following findings were obtained.

That is, as a result of a detailed analysis of the electrical characteristics of a QD display device, it was found that a plurality of current transport mechanisms exist in a QD display device including a mix of organic material and inorganic material. In particular, it was found that an invalid current that is not injected into the QDs is a cause of a decrease in the EQE and that it is necessary to suppress this current.

Here, the invalid current is a space charge limited current and is proportional to the square of the voltage and the interelectrode distance to the power of −3. Thus, the increase in the interelectrode distance and the relaxation of the electric field concentration are effective for suppressing the invalid current.

Based on these findings, novel structures and materials were studied, and the configuration of the present embodiment was reached based on a configuration in which NiO nanoparticles having excellent characteristics are used in the hole injection layer. However, as described above, the configuration according to the present embodiment is not limited to a configuration in which NiO nanoparticles are used in the hole injection layer.

Note that though the monolayer film 28 has been described as only a monolayer film, the monolayer film 28 may have a structure of monolayer layers formed by a special process. By adopting a monolayer layered structure, a configuration with a thicker monolayer film or a monolayer layered film can be obtained, and by having a thicker film, the effect of reducing the invalid current can be further enhanced, which is preferable.

Note that the configuration according to the present embodiment can be combined with the configuration according to the first embodiment and/or the second embodiment described above. For example, the hole injection layer 20 may include the nanoparticles 40 smaller than the quantum dots 50 and the solvent 42 having a high polarity and a low vapor pressure, the nanoparticles 40 may be dispersed in the solvent 42, and the ratio of the nanoparticles 40 may be high such that unevenness is formed on the upper face of the hole injection layer 20 by the nanoparticles 40.

The scope of the disclosure is not limited by the foregoing. A configuration in which any function layer, for example, any one or more layers of the hole transport layer 22, the electron transport layer 26, the electron injection layer, and the like includes nanoparticles of a metal compound having charge transport properties and a solvent having high polarity and low vapor pressure is included in the scope of the disclosure.

In the above description, the description of the hole injection layer can be interpreted as long as there is no contradiction by replacing the term "hole injection layer" with "hole transport layer". In a similar manner, when interpreting the description of the electron transport layer or the electron injection layer, it can be interpreted as long as there is no contradiction by replacing the term "hole injection layer" with the term "electron transport layer" or "electron injection layer" and reversing the positive and negative of the charge.

The disclosure is not limited to the embodiments described above, and various modifications may be made within the scope of the claims. Embodiments obtained by appropriately combining technical approaches disclosed in the different embodiments also fall within the technical scope of the disclosure. Furthermore, novel technical features can be formed by combining the technical approaches disclosed in each of the embodiments.

The invention claimed is:

1. A light-emitting element comprising:

an anode;

a cathode facing the anode;

a light-emitting layer including quantum dots, the light-emitting layer being provided between the anode and the cathode;

a hole injection layer and a hole transport layer provided in this order from the anode side between the anode and the light-emitting layer; and a monolayer film provided between the hole injection layer and the hole transport layer, wherein the hole injection layer includes nanoparticles made from an inorganic material.

2. The light-emitting element according to claim 1, wherein the hole injection layer includes a compound including a metal element, the compound includes at least one selected from Ni, Mg, Al, Zn, Fe, Sn, Cu, Cr, Ta, Mo, W, and Re, and the compound includes at least one type of metal oxide.

3. The light-emitting element according to claim 2, wherein the metal element included in the hole injection layer includes Ni, Ni included in the hole injection layer forms a compound, and the compound includes at least one selected from oxygen, a hydroxyl group, carbon, and nitrogen and includes at least one selected from nickel (I) oxide, nickel (II) oxide, nickel (III) oxide, nickel hydroxide, nickel nitrate, and nickel carbonate.

4. The light-emitting element according to claim 3, wherein Ni included in the hole injection layer includes Ni having at least two types of valences.

5. The light-emitting element according to claim 1, wherein the nanoparticles included in the hole injection layer are substantially spherical bodies or spheroids.

6. The light-emitting element according to claim 1, wherein molecules included in the monolayer film have hole transport properties.

7. The light-emitting element according to claim 1, wherein molecules included in the monolayer film include a functional group at one end.

8. The light-emitting element according to claim 1, wherein molecules included in the monolayer film include a functional group, and the molecules include at least one molecule selected from R—SH, RS—SR', R—RSCN, R—SeH, R—TeH, RSe—SeR', R—NC, R—NCO, R—$SiH_3$, R—$Si(CH_3)_2H$, R—$Si(CH_3)_3$, R—COOH, dye-COOH, R—$PO_3H_2$, RO—$PO_3H_2$, R—$SiX_2$[X=Cl, $OCH_3$, $OC_2H_5$], R—$NH_2$, R—OH, $[R—C(O)O]_2$, R—CH═$CH_2$, R—C≡CH, R—$MgBr_2$, R—Li, Ar—$N_2^+X^-$, and R—BrR—CH═$CH_2$, where R and R' represent the functional group.

9. The light-emitting element according to claim 1, wherein the monolayer film includes at least one selected from MeO-2PACz, BA-$CF_3$, 2PACz, and Me-4PACz.

10. The light-emitting element according to claim 1, wherein the monolayer film is provided only on a face side of the hole injection layer facing the light-emitting layer.

11. The light-emitting element according to claim 1, wherein in the monolayer film, a plurality of same molecules are arranged adjacent to one another.

12. The light-emitting element according to claim 1, wherein the hole transport layer includes a compound including a C-H bond at a part of the molecular structure, and a thickness of the hole transport layer is from 1 nm to 50 nm.

13. The light-emitting element according to claim 1, wherein a thickness of the hole injection layer is from 1 nm to 50 nm.

* * * * *